(12) United States Patent
Kim et al.

(10) Patent No.: US 11,380,686 B2
(45) Date of Patent: Jul. 5, 2022

(54) SEMICONDUCTOR DEVICES INCLUDING WORK FUNCTION LAYERS

(71) Applicant: Samsung Electronics Co., Ltd., Suwon-si (KR)

(72) Inventors: Juyoun Kim, Suwon-si (KR); Seulgi Yun, Hwaseong-si (KR); Seki Hong, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 72 days.

(21) Appl. No.: 17/101,472

(22) Filed: Nov. 23, 2020

(65) Prior Publication Data

US 2021/0398978 A1 Dec. 23, 2021

(30) Foreign Application Priority Data

Jun. 19, 2020 (KR) .......... 10-2020-0074713

(51) Int. Cl.
*H01L 27/092* (2006.01)
*H01L 21/8238* (2006.01)

(52) U.S. Cl.
CPC .. *H01L 27/0924* (2013.01); *H01L 21/823842* (2013.01); *H01L 21/823821* (2013.01)

(58) Field of Classification Search
CPC ......... H01L 27/0924; H01L 21/823842; H01L 21/823821
See application file for complete search history.

(56) References Cited

U.S. PATENT DOCUMENTS

| | | |
|---|---|---|
| 4,016,476 A | 4/1977 | Morokawa et al. |
| 4,074,351 A | 2/1978 | Boone et al. |
| 4,080,600 A | 3/1978 | Toman |
| 4,114,049 A | 9/1978 | Suzuki |
| 4,168,459 A | 9/1979 | Roesel, Jr. |
| 4,169,990 A | 10/1979 | Lerdman |
| 4,201,976 A | 5/1980 | Patel |
| 4,255,789 A | 3/1981 | Hartford et al. |
| 4,412,285 A | 10/1983 | Neches et al. |
| 4,486,739 A | 12/1984 | Franaszek et al. |
| 4,514,694 A | 4/1985 | Finger |
| 4,540,921 A | 9/1985 | Boyd, Jr. et al. |
| 4,706,133 A | 11/1987 | Giddings |
| 4,709,293 A | 11/1987 | Gershen et al. |
| 4,721,853 A | 1/1988 | Wraight |
| 4,750,036 A | 6/1988 | Martinez |
| 4,761,768 A | 8/1988 | Turner et al. |

(Continued)

*Primary Examiner* — Christine A Enad
(74) *Attorney, Agent, or Firm* — Harness, Dickey & Pierce, P.L.C.

(57) ABSTRACT

A semiconductor device includes first and second transistors on a substrate. The first transistor includes a first N-type active region, a first gate electrode having a first work function layer, and a first gate dielectric layer having high-k dielectrics containing La. The first work function layer includes a first layer having TiON, a second layer having TiN or TiON, a third layer having TiON, a fourth layer having TiN, and a fifth layer having TiAlC. The second transistor includes a first P-type active region, a second gate electrode having a second work function layer, and a second gate dielectric layer having high-k dielectrics. The second work function layer includes the fifth layer directly contacting the second gate dielectric layer.

20 Claims, 31 Drawing Sheets

(56) References Cited

U.S. PATENT DOCUMENTS

| | | |
|---|---|---|
| 4,841,925 A | 6/1989 | Ward |
| 4,860,290 A | 8/1989 | Daniels et al. |
| 4,959,812 A | 9/1990 | Momodomi et al. |
| 4,985,832 A | 1/1991 | Grondalski |
| 5,128,984 A | 7/1992 | Katz |
| 5,270,979 A | 12/1993 | Harari et al. |
| 5,342,034 A | 8/1994 | Mandel et al. |
| 5,477,165 A | 12/1995 | ElAyat et al. |
| 5,481,553 A | 1/1996 | Suzuki et al. |
| 5,491,804 A | 2/1996 | Heath et al. |
| 5,583,457 A | 12/1996 | Horiguchi et al. |
| 5,637,090 A | 6/1997 | McGee et al. |
| 5,783,956 A | 7/1998 | Ooishi |
| 5,892,900 A | 4/1999 | Ginter et al. |
| 5,976,259 A | 11/1999 | Yamazaki |
| 6,081,757 A | 6/2000 | Breed et al. |
| 6,289,306 B1 | 9/2001 | Van Der Vleuten et al. |
| 6,297,627 B1 | 10/2001 | Towne et al. |
| 6,388,533 B2 | 5/2002 | Swoboda |
| 6,403,943 B2 | 6/2002 | Wada et al. |
| 6,583,972 B2 | 6/2003 | Verhaege et al. |
| 6,618,048 B1 | 9/2003 | Leather |
| 6,624,699 B2 | 9/2003 | Yin et al. |
| 6,630,885 B2 | 10/2003 | Hardman et al. |
| 6,690,347 B2 | 2/2004 | Jeon et al. |
| 6,695,936 B2 | 2/2004 | Johnson |
| 6,798,148 B2 | 9/2004 | Inukai |
| 6,825,644 B2 | 11/2004 | Kernahan et al. |
| 6,855,929 B2 | 2/2005 | Kimba et al. |
| 6,856,546 B2 | 2/2005 | Guterman et al. |
| 6,867,638 B2 | 3/2005 | Saiki et al. |
| 6,903,731 B2 | 6/2005 | Inukai |
| 6,998,722 B2 | 2/2006 | Madurawe |
| 7,053,009 B2 | 5/2006 | Conley, Jr. et al. |
| 7,053,890 B2 | 5/2006 | Inukai |
| 7,084,666 B2 | 8/2006 | Madurawe |
| 7,106,292 B2 | 9/2006 | Moon |
| 7,136,058 B2 | 11/2006 | Nakamura et al. |
| 7,153,454 B2 | 12/2006 | Khoshnevis |
| 7,161,476 B2 | 1/2007 | Hardman et al. |
| 7,170,802 B2 | 1/2007 | Cernea et al. |
| 7,358,806 B2 | 4/2008 | Burns et al. |
| 7,403,424 B2 | 7/2008 | Hemink et al. |
| 7,408,804 B2 | 8/2008 | Hemink et al. |
| 7,486,564 B2 | 2/2009 | Hemink et al. |
| 7,761,800 B2 | 7/2010 | Chaudhri et al. |
| 7,986,042 B2 | 7/2011 | Or-Bach et al. |
| 8,079,983 B2 | 12/2011 | Rush et al. |
| 8,250,271 B2 | 8/2012 | Swing et al. |
| 8,299,494 B2 | 10/2012 | Yilmaz et al. |
| 8,313,639 B2 | 11/2012 | Rothberg et al. |
| 8,626,223 B2 | 1/2014 | Brisebois et al. |
| 8,759,872 B2 | 6/2014 | Arghavani et al. |
| 8,838,135 B2 | 9/2014 | Moshfeghi |
| 8,971,124 B1 | 3/2015 | Manning |
| 9,048,219 B2 | 6/2015 | Kim et al. |
| 9,160,287 B2 | 10/2015 | Britta et al. |
| 9,219,445 B2 | 12/2015 | Nobbe et al. |
| 9,340,353 B2 | 5/2016 | Oren et al. |
| 9,413,298 B2 | 8/2016 | Nobbe et al. |
| 9,443,097 B2 | 9/2016 | O'Hare et al. |
| 9,483,610 B2 | 11/2016 | McMillen et al. |
| 9,698,269 B2 | 7/2017 | Tong et al. |
| 9,716,477 B2 | 7/2017 | Wagh et al. |
| 9,730,105 B2 | 8/2017 | Bhushan et al. |
| 9,859,392 B2 | 1/2018 | Lim et al. |
| 9,862,551 B2 | 1/2018 | Oren et al. |
| 9,969,564 B2 | 5/2018 | Oren et al. |
| 9,991,357 B2 | 6/2018 | Song et al. |
| 10,154,437 B2 | 12/2018 | Bhushan et al. |
| 10,249,379 B2 | 4/2019 | Chung |
| 10,314,077 B2 | 6/2019 | Bhushan et al. |
| 10,461,167 B2 | 10/2019 | Lee et al. |
| 10,734,288 B2 * | 8/2020 | Kim ............... H01L 21/823814 |
| 2019/0096770 A1 | 3/2019 | Hong et al. |
| 2019/0157165 A1 * | 5/2019 | Kim ............... H01L 21/823821 |
| 2019/0287811 A1 * | 9/2019 | He ............... H01L 21/823842 |
| 2021/0305411 A1 * | 9/2021 | Savant ............... H01L 21/3105 |

* cited by examiner

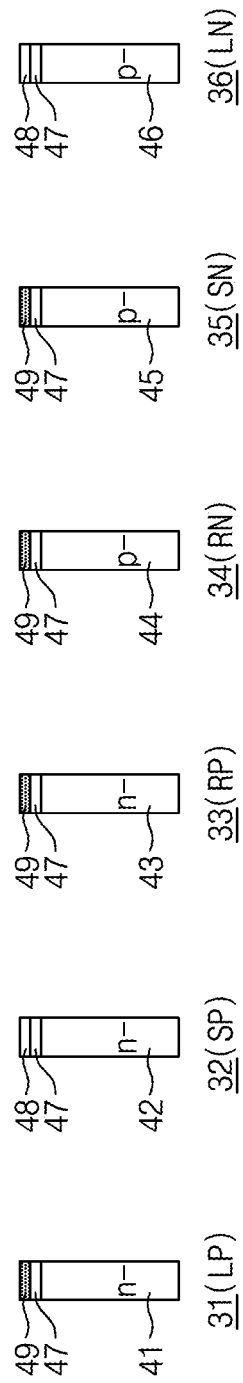
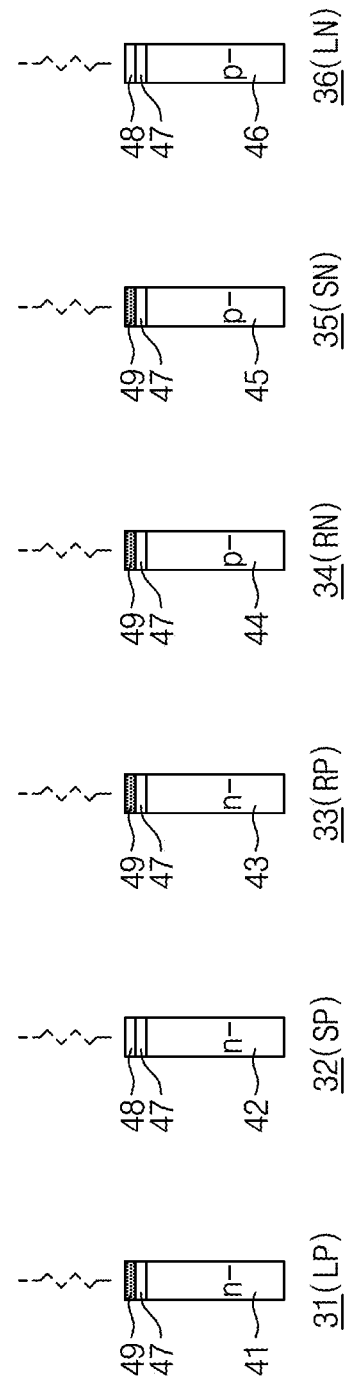

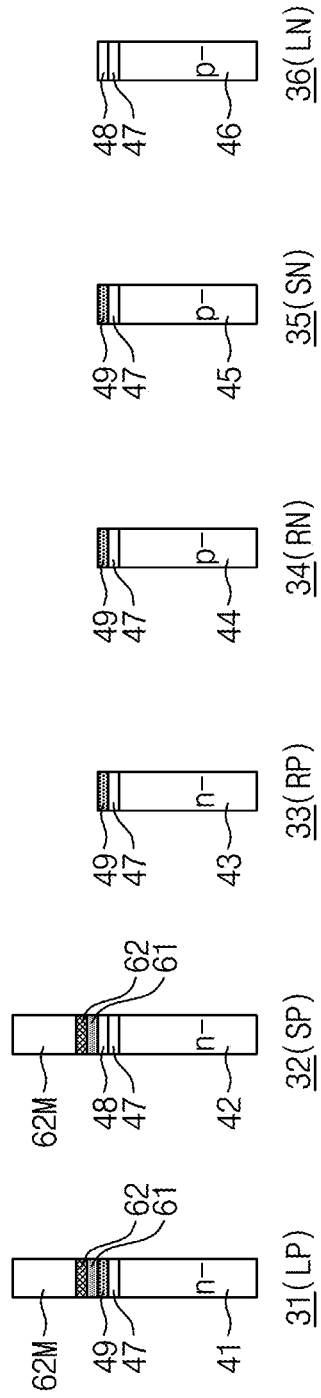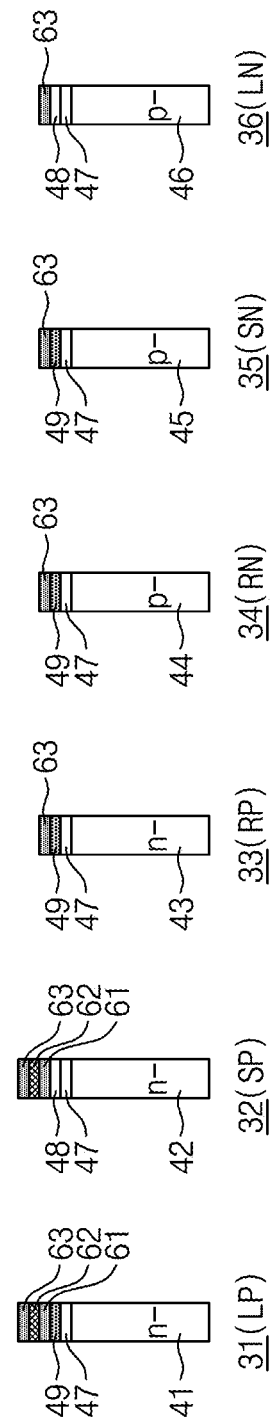

SEMICONDUCTOR DEVICES INCLUDING WORK FUNCTION LAYERS

CROSS-REFERENCE TO THE RELATED APPLICATION

This U.S. non-provisional patent application claims priority from Korean Patent Application No. 10-2020-0074713, filed on Jun. 19, 2020, in the Korean Intellectual Property Office (KIPO), the disclosure of which is incorporated herein by reference in its entirety.

BACKGROUND

1. Field

Example embodiments of the disclosure relate to semiconductor devices having work function layers and/or formation methods thereof.

2. Description of Related Art

In accordance with high integration of a semiconductor device, research on technology for disposing a plurality of transistors having different threshold voltages on a substrate is being conducted. Use of a plurality of processes executed in a sequential manner for embodiment of a plurality of transistors having different threshold voltages is very disadvantageous in terms of mass production efficiency. An increase in the number of processes may increase scattering of electrical characteristics of transistors.

SUMMARY

Example embodiments of the disclosure provide semiconductor devices having superior electrical characteristics while being advantageous in terms of mass production efficiency and/or formation methods thereof.

A semiconductor device according to example embodiments of the disclosure includes a substrate, a first transistor on the substrate, and a second transistor on the substrate. The first transistor has a first threshold voltage. The first transistor includes a first N-type active region defined on the substrate, a first gate electrode extending across the first N-type active region, and a first gate dielectric layer between the first N-type active region and the first gate electrode. The first gate electrode has a first work function layer. The first gate dielectric layer has high-k dielectrics containing La. The first work function layer includes a first layer on the first gate dielectric layer and having TiON, a second layer on the first layer and having TiN or TiON, a third layer on the second layer and having TiON, a fourth layer on the third layer and having TiN, and a fifth layer on the fourth layer and having TiAlC. The second transistor has a second threshold voltage different from the first threshold voltage. The second transistor includes a first P-type active region defined on the substrate, a second gate electrode extending across the first P-type active region, and a second gate dielectric layer between the first P-type active region and the second gate electrode. The second gate electrode has a second work function layer. The second gate dielectric layer has high-k dielectrics. The second work function layer includes the fifth layer directly contacting the second gate dielectric layer.

A semiconductor device according to example embodiments of the disclosure includes a substrate, a first transistor on the substrate, and a second transistor on the substrate. The first transistor has a first threshold voltage. The first transistor includes a first N-type active region having a plurality of first N-type active patterns vertically aligned on the substrate, a first gate electrode extending across the first N-type active region, and a first gate dielectric layer between the first N-type active region and the first gate electrode. The first gate electrode has a first work function layer. The first gate dielectric layer has high-k dielectrics containing La. The first work function layer includes a first layer on the first gate dielectric layer and having TiON, a second layer on the first layer and having TiN or TiON, a third layer on the second layer and having TiON, a fourth layer on the third layer and having TiN, and a fifth layer on the fourth layer and having TiAlC. The second transistor has a second threshold voltage different from the first threshold voltage. The second transistor includes a first P-type active region having a plurality of first P-type active patterns vertically aligned on the substrate, a second gate electrode extending across the first P-type active region, and a second gate dielectric layer between the first P-type active region and the second gate electrode. The second gate electrode has a second work function layer. The second gate dielectric layer has high-k dielectrics. The second work function layer includes the fifth layer directly contacting the second gate dielectric layer.

A semiconductor device according to example embodiments of the disclosure includes a substrate, first to third N-type active regions and first to third P-type active regions on the substrate, first to sixth gate electrodes, a first gate dielectric layer, a second gate dielectric layer, and first to fifth layers on the substrate. The first to third N-type active regions and first to third P-type active regions are spaced apart from one another. The first gate electrode extends across the first N-type active region and has a first work function layer. The second gate electrode extends across the first P-type active region and has a second work function layer. The third gate electrode extends across the second N-type active region and has a third work function layer. The fourth gate electrode extends across the third N-type active region and has a fourth work function layer. The fifth gate electrode extends across the second P-type active region and has a fifth work function layer. The sixth gate electrode extends across the third P-type active region and has a sixth work function layer. The first gate dielectric layer has high-k dielectrics containing La. The first gate dielectric layer is provided between the first N-type active region and the first gate electrode. The first gate dielectric layer is provided between the third N-type active region and the fourth gate electrode. The first gate dielectric layer is provided between the second P-type active region and the fifth gate electrode. The first gate dielectric layer is provided between the third P-type active region and the sixth gate electrode. The second gate dielectric layer has high-k dielectrics. The second gate dielectric layer is provided between the first P-type active region and the second gate electrode and between the second N-type active region and the third gate electrode. The first layer includes TiON. The second layer includes TiN or TiON. The third layer includes TiON. The fourth layer includes TiN. The fifth layer includes TiAlC. The first work function layer includes the first layer on the first gate dielectric layer, the second layer on the first layer, the third layer on the second layer, the fourth layer on the third layer, and the fifth layer on the fourth layer. The second work function layer includes the fifth layer directly contacting the second gate dielectric layer. The third work function layer includes first layer on the second gate dielectric layer, the second layer on the first layer, the third layer on the second layer, the fourth layer on the third layer, and the fifth layer on the fourth layer. The fourth work function layer includes the third layer on the first gate dielectric layer, the fourth layer on the third layer, and the fifth layer on the fourth layer. The fifth work function layer includes the fourth layer on the first gate dielectric layer and the fifth layer on the fourth layer. The sixth work function layer includes the fifth layer directly contacting the first gate dielectric layer.

BRIEF DESCRIPTION OF THE DRAWINGS

FIGS. 28 to 43 are sectional views explaining formation methods of semiconductor devices according to example embodiments of the disclosure.

DETAILED DESCRIPTION OF EXAMPLE EMBODIMENTS

Figure 1:
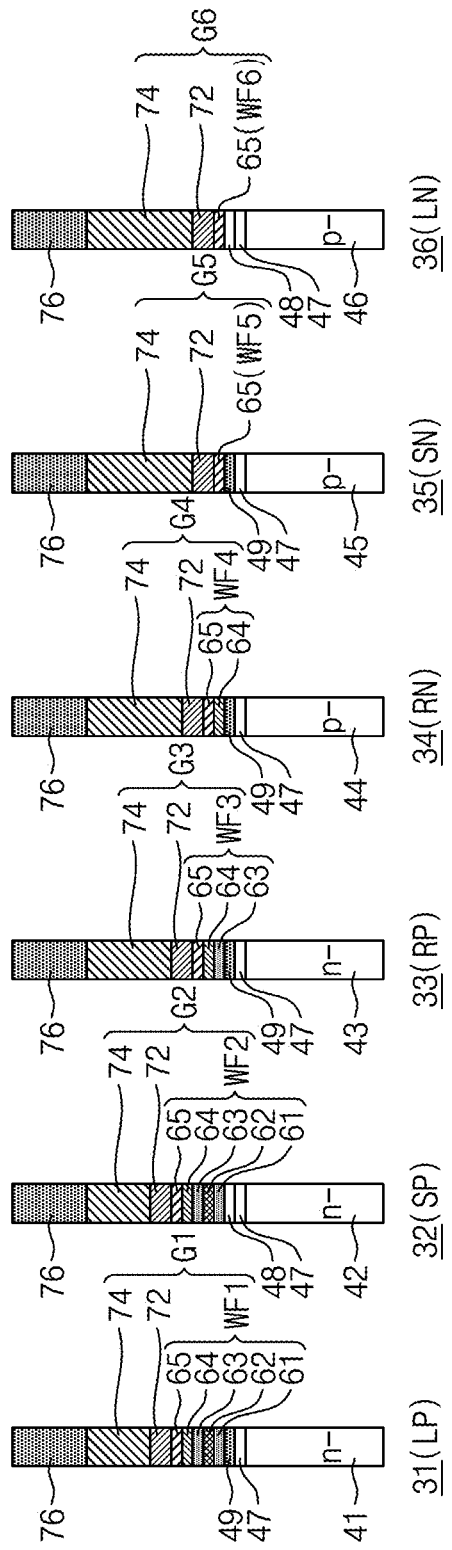
FIG. 1 is sectional views explaining semiconductor devices according to example embodiments of the disclosure.
Figure 2:
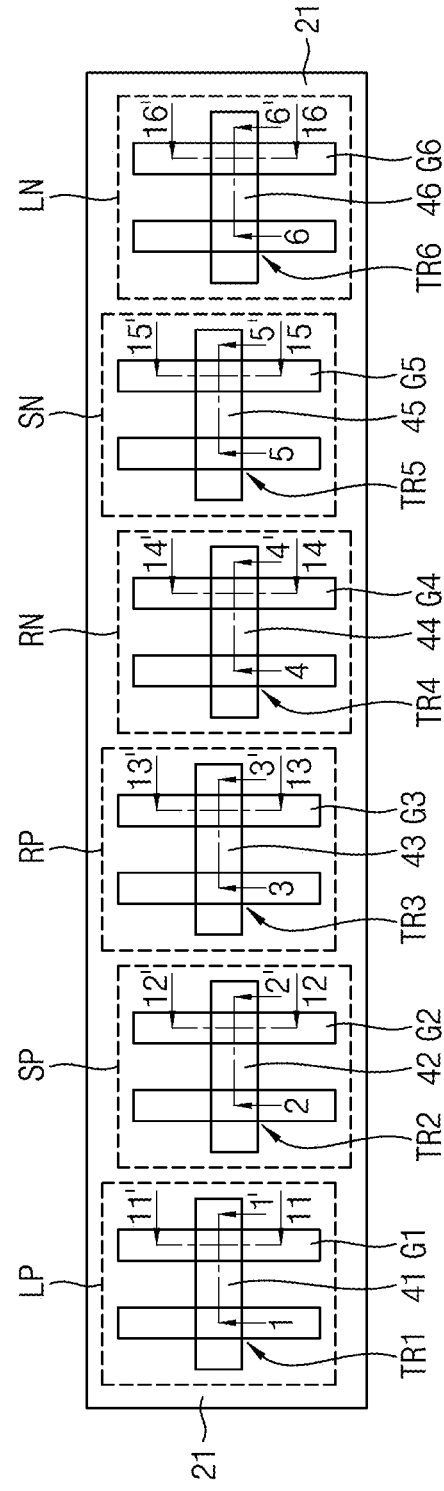
FIG. 2 is a layout explaining semiconductor devices according to example embodiments of the disclosure.
Figure 3:
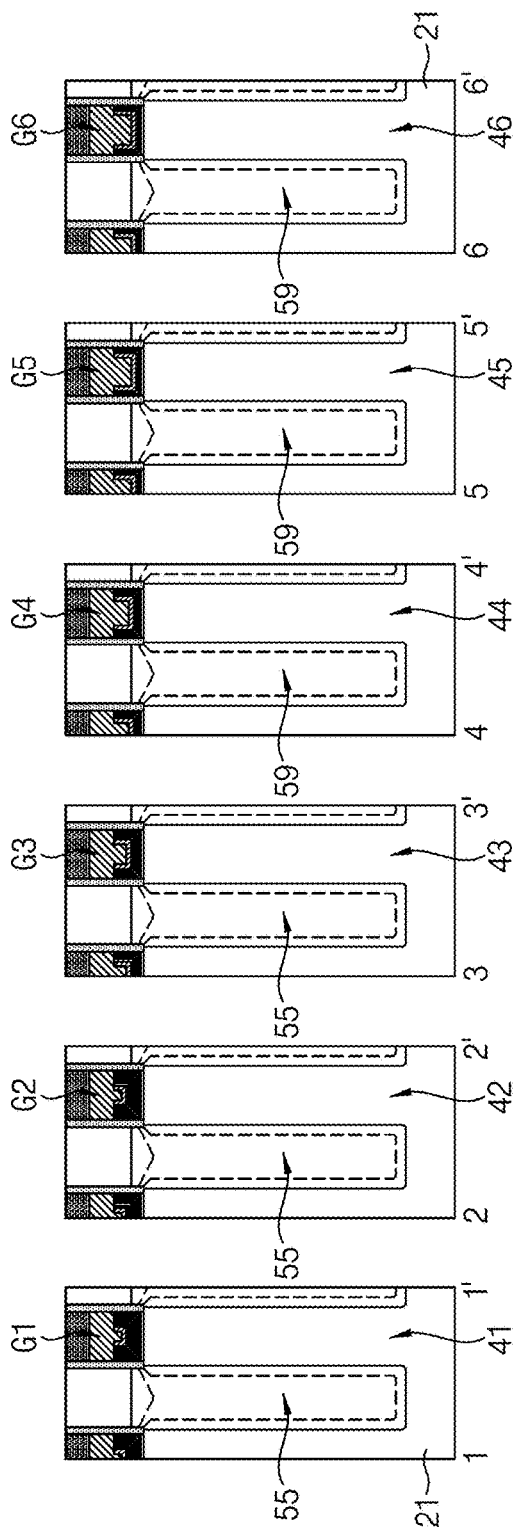
FIGS. 3 to 27 are sectional views explaining semiconductor devices according to example embodiments of the disclosure.
Figure 4:
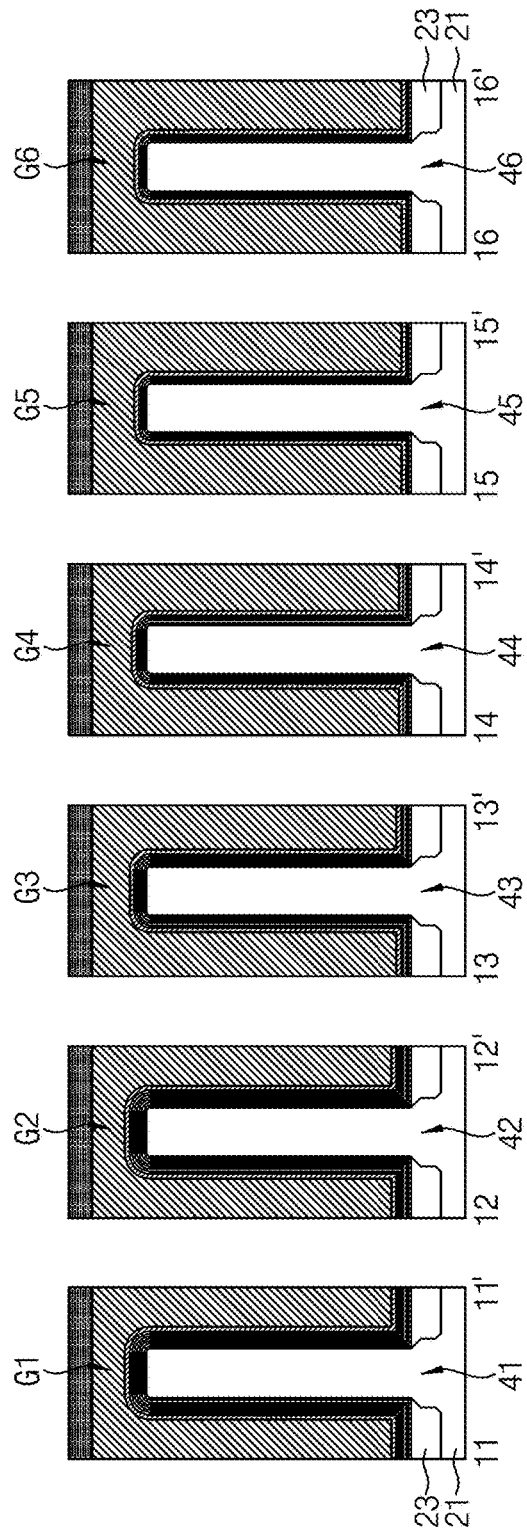
Figure 5:
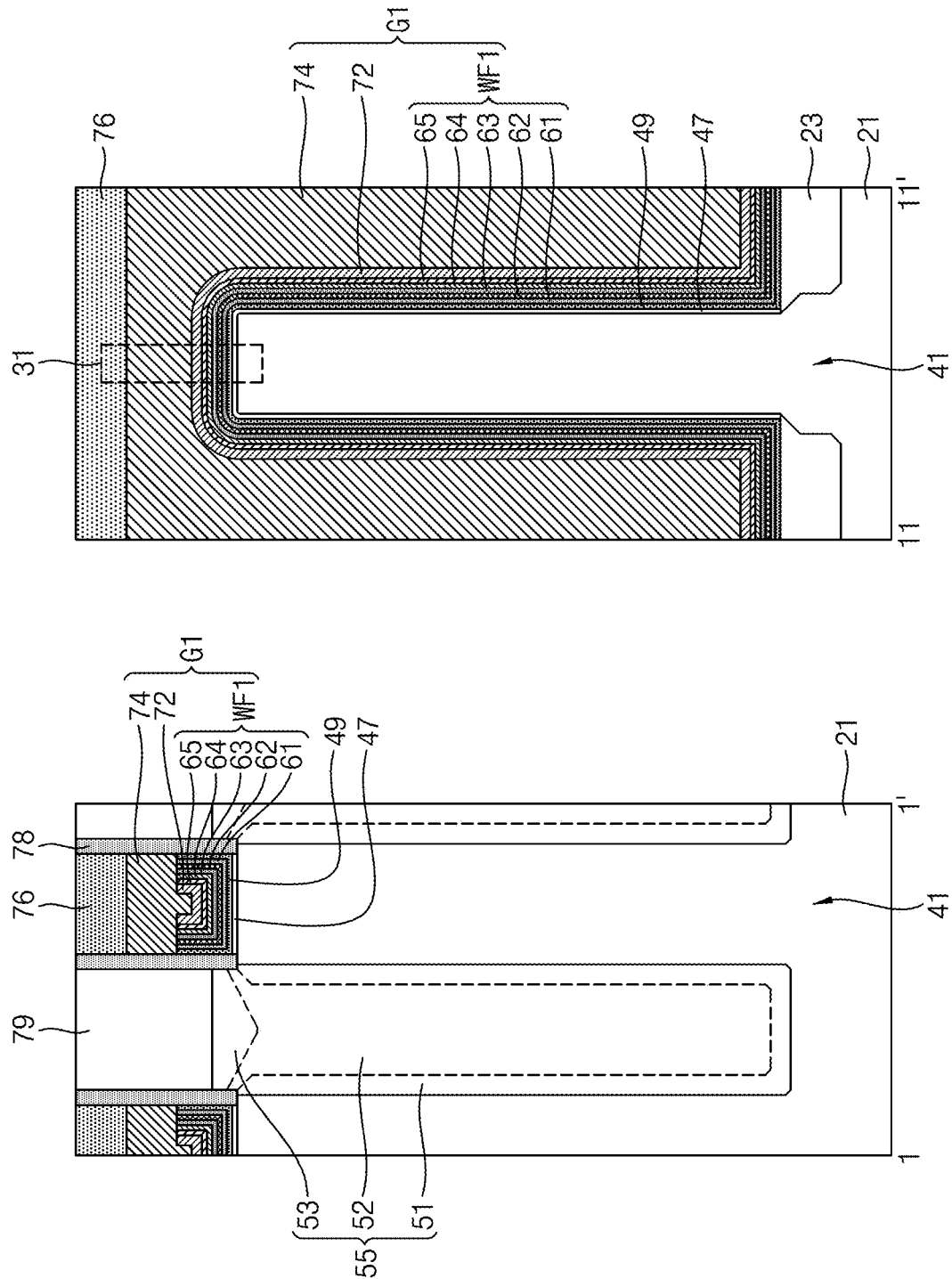
Figure 6:
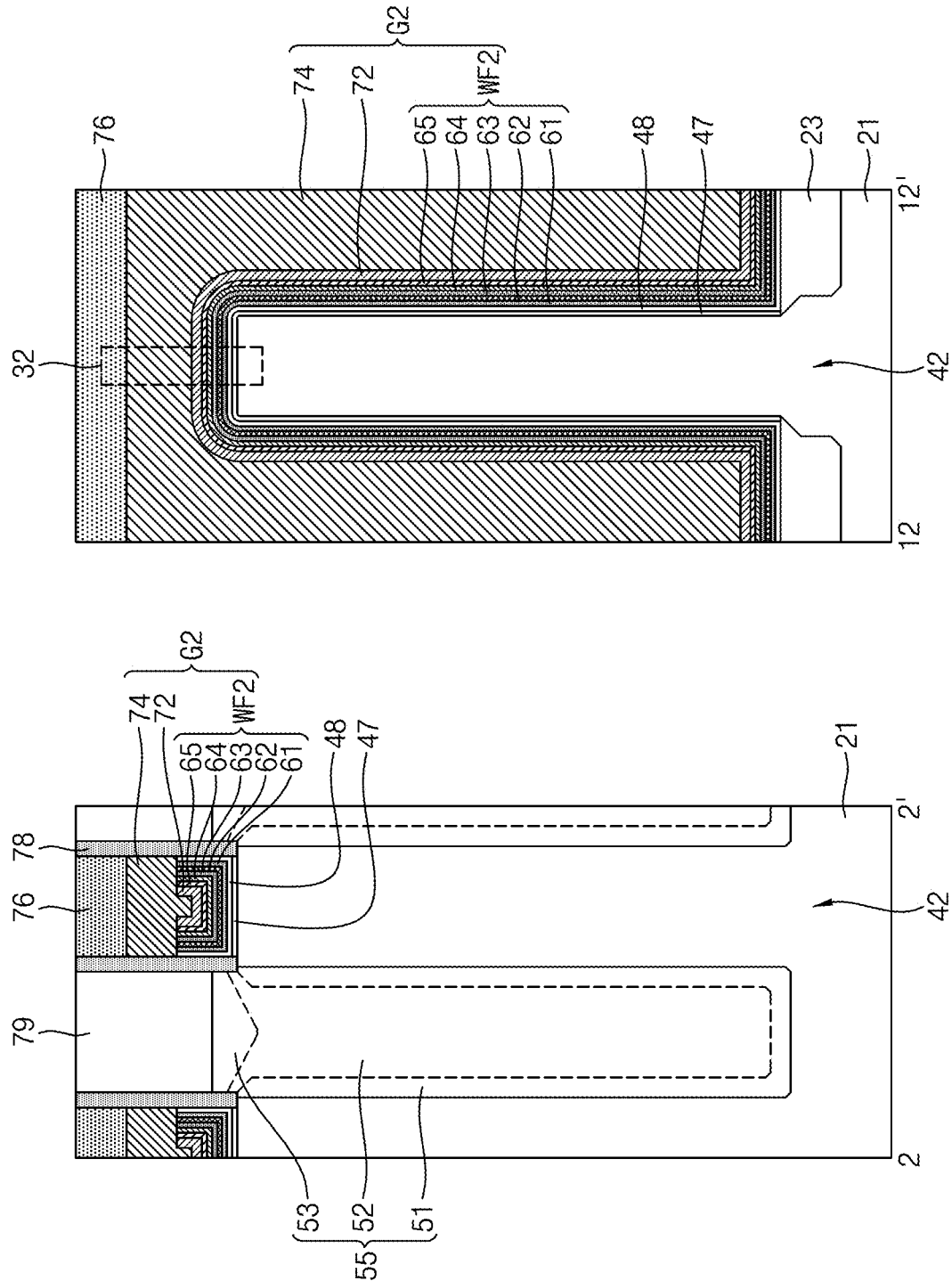
Figure 7:
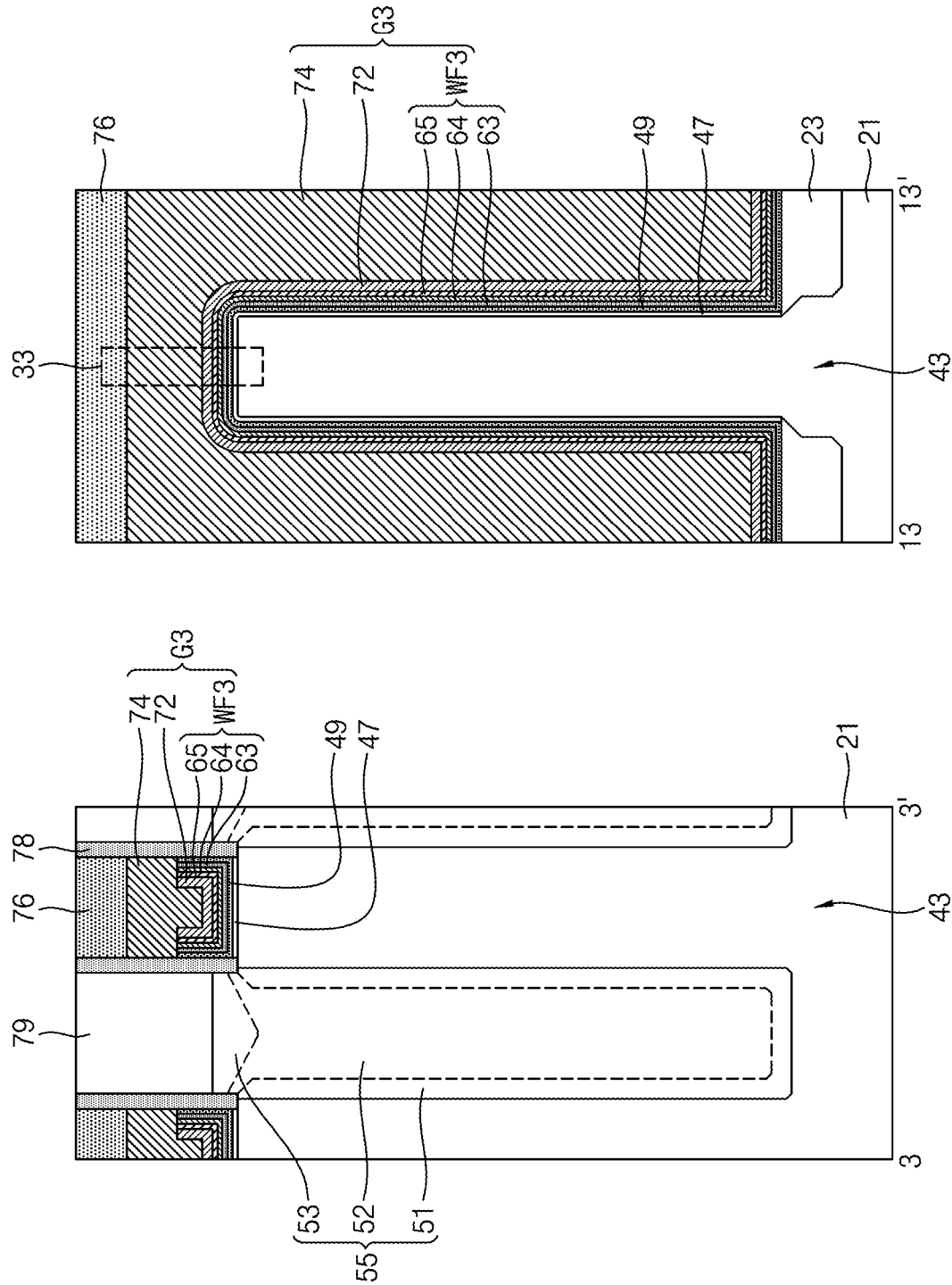
Figure 8:
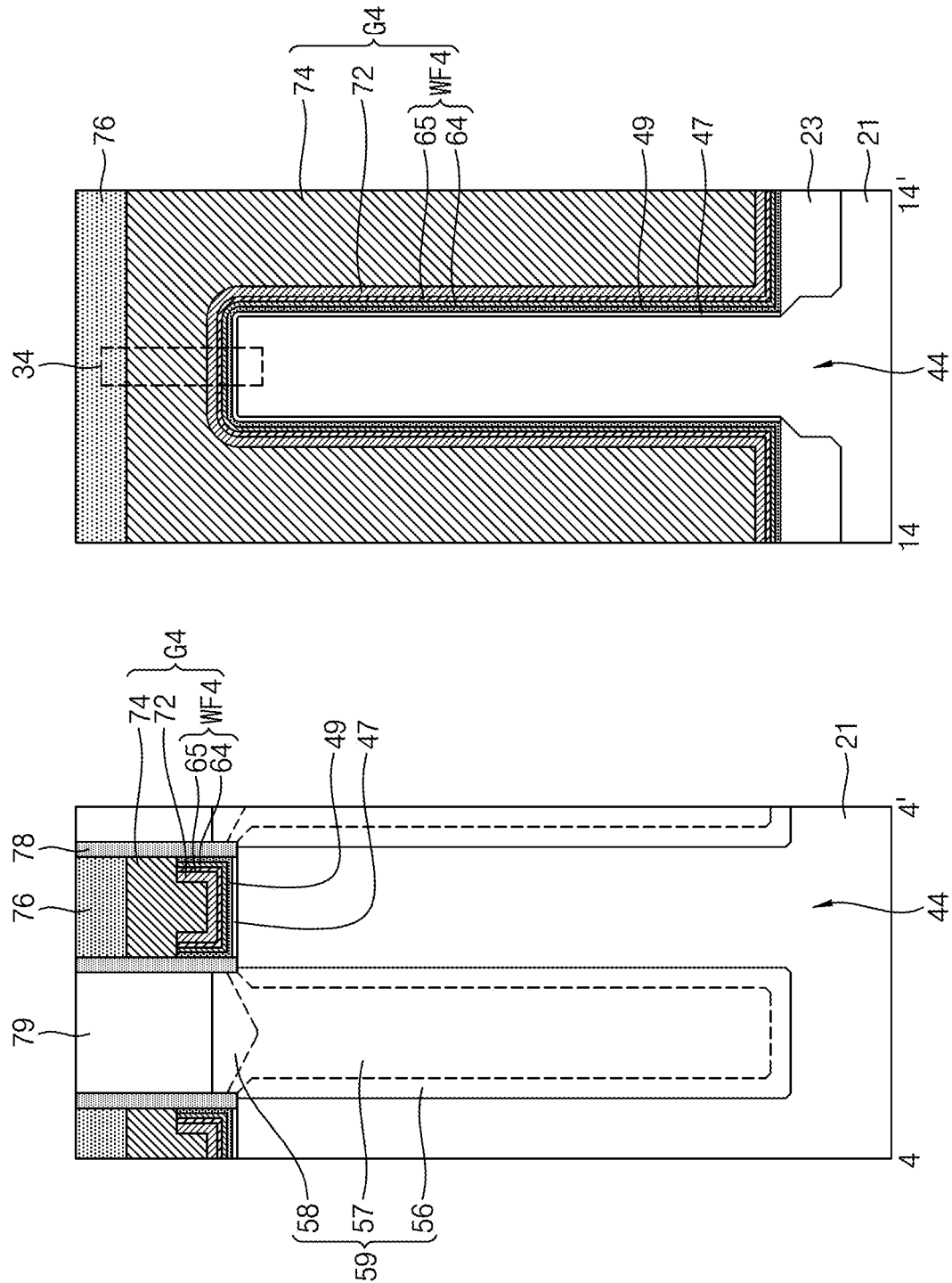
Figure 9:
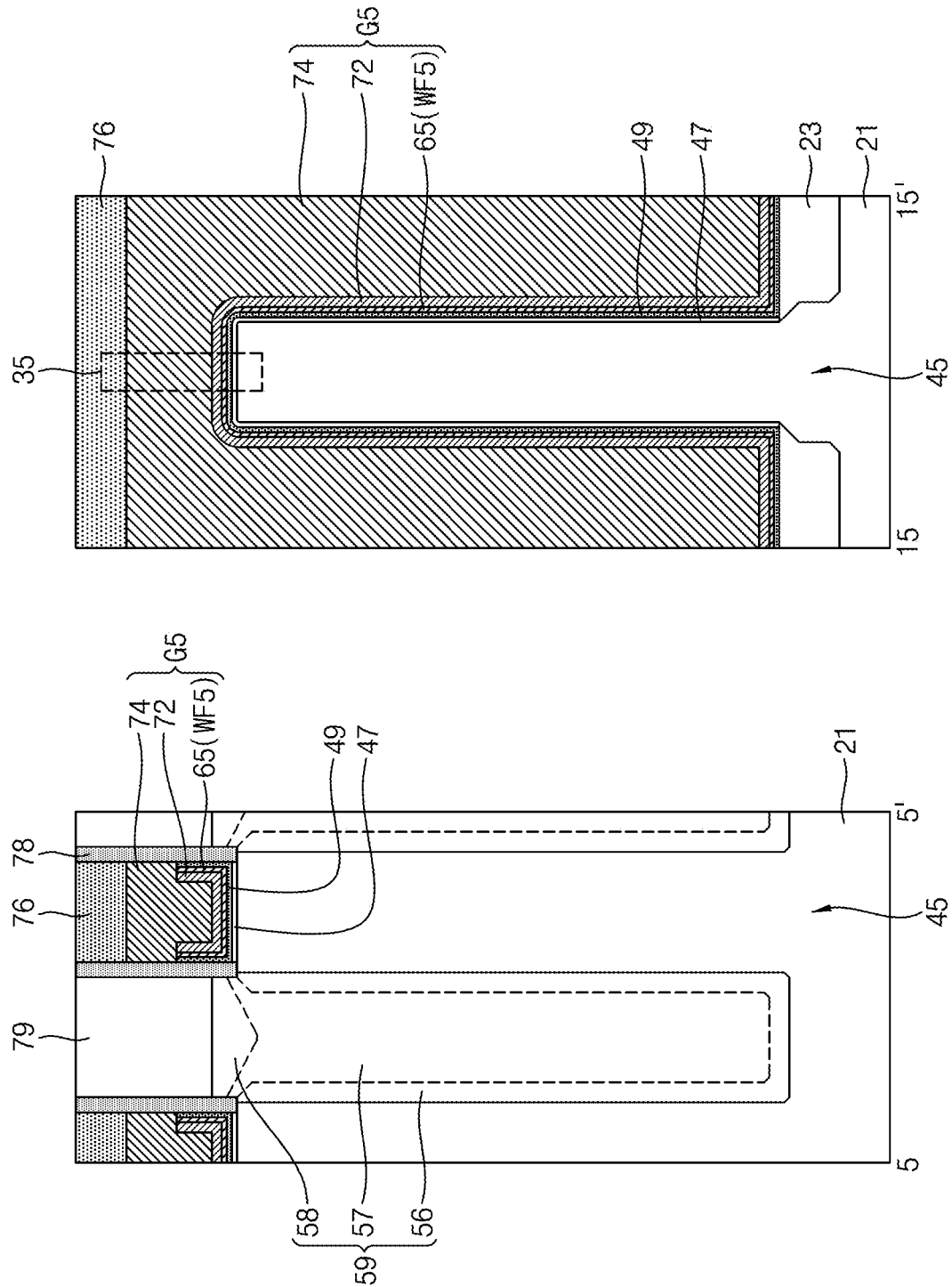
Figure 10:
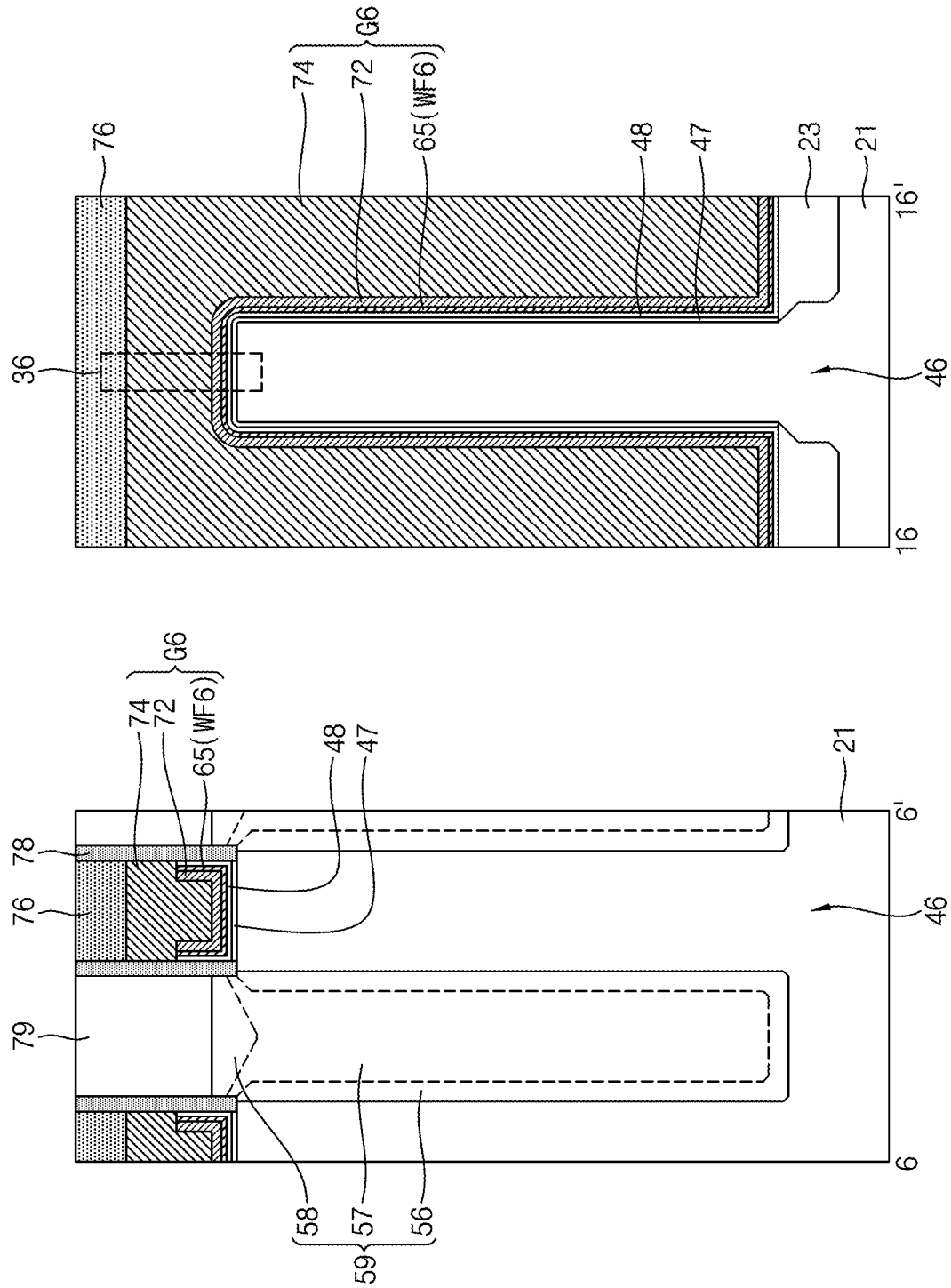

FIG. 1 is sectional views explaining semiconductor devices according to example embodiments of the disclosure. FIG. 2 is a layout explaining semiconductor devices according to example embodiments of the disclosure. FIG. 3 is cross-sectional views taken along lines 1-1', 2-2', 3-3', 4-4', 5-5' and 6-6' in FIG. 2. FIG. 4 is cross-sectional views taken along lines 11-11', 12-12', 13-13', 14-14', 15-15' and 16-16' in FIG. 2. FIG. 5 is cross-sectional views taken along lines 1-1' and 11-11' in FIG. 2. FIG. 6 is cross-sectional views taken along lines 2-2' and 12-12' in FIG. 2. FIG. 7 is cross-sectional views taken along lines 3-3' and 13-13' in FIG. 2. FIG. 8 is cross-sectional views taken along lines 4-4' and 14-14' in FIG. 2. FIG. 9 is cross-sectional views taken along lines 5-5' and 15-15' in FIG. 2. FIG. 10 is cross-sectional views taken along lines 6-6' and 16-16' in FIG. 2. FIG. 1 may correspond to an enlarged view showing a first portion 31 of FIG. 5, a second portion 32 of FIG. 6, a third portion 33 of FIG. 7, a fourth portion 34 of FIG. 8, a fifth portion 35 of FIG. 9, and a sixth portion 36 of FIG. 10.

Referring to FIG. 1, the semiconductor devices according to example embodiments of the disclosure may include first to sixth active regions 41 to 46, an interface dielectric layer 47, a plurality of first and second gate dielectric layers 48 and 49, first to sixth gate electrodes G1 to G6, and a gate capping layer 76.

The interface dielectric layer 47, the second gate dielectric layer 49, the first gate electrode G1, and the gate capping layer 76 may be sequentially stacked on the first active region 41. The interface dielectric layer 47, the first gate dielectric layer 48, the second gate electrode G2, and the gate capping layer 76 may be sequentially stacked on the second active region 42. The interface dielectric layer 47, the second gate dielectric layer 49, the third gate electrode G3, and the gate capping layer 76 may be sequentially stacked on the third active region 43.

The interface dielectric layer 47, the second gate dielectric layer 49, the fourth gate electrode G4, and the gate capping layer 76 may be sequentially stacked on the fourth active region 44. The interface dielectric layer 47, the second gate dielectric layer 49, the fifth gate electrode G5, and the gate capping layer 76 may be sequentially stacked on the fifth active region 45. The interface dielectric layer 47, the first gate dielectric layer 48, the sixth gate electrode G6, and the gate capping layer 76 may be sequentially stacked on the sixth active region 46.

The first gate electrode G1 may include a first work function layer WF1, a first gate conductive layer 72 and a second gate conductive layer 74 which are sequentially stacked. The first work function layer WF1 may include a first layer 61, a second layer 62, a third layer 63, a fourth layer 64 and a fifth layer 65 which are sequentially stacked. The first layer 61 may directly contact the second gate dielectric layer 49.

The second gate electrode G2 may include a second work function layer WF2, the first gate conductive layer 72 and the second gate conductive layer 74 which are sequentially stacked. The second work function layer WF2 may include the first layer 61, the second layer 62, the third layer 63, the fourth layer 64 and the fifth layer 65 which are sequentially stacked. The first layer 61 may directly contact the first gate dielectric layer 48.

The third gate electrode G3 may include a third work function layer WF3, the first gate conductive layer 72 and the second gate conductive layer 74 which are sequentially stacked. The third work function layer WF3 may include the third layer 63, the fourth layer 64 and the fifth layer 65 which are sequentially stacked. The third layer 63 may directly contact the second gate dielectric layer 49.

The fourth gate electrode G4 may include a fourth work function layer WF4, the first gate conductive layer 72 and the second gate conductive layer 74 which are sequentially stacked. The fourth work function layer WF4 may include the fourth layer 64 and the fifth layer 65 which are sequentially stacked. The fourth layer 64 may directly contact the second gate dielectric layer 49.

The fifth gate electrode G5 may include a fifth work function layer WF5, the first gate conductive layer 72 and the second gate conductive layer 74 which are sequentially stacked. The fifth work function layer WF5 may include the fifth layer 65. The fifth layer 65 may directly contact the second gate dielectric layer 49.

The sixth gate electrode G6 may include a sixth work function layer WF6, the first gate conductive layer 72 and the second conductive layer 74 which are sequentially stacked. The sixth work function layer WF6 may include the fifth layer 65. The fifth layer 65 may directly contact the first gate dielectric layer 48.

Each of the first to third active regions 41 to 43 may include a semiconductor layer having N-type impurities. Each of the first to third active regions 41 to 43 may include a semiconductor layer having P-type impurities. Each of the fourth to sixth active regions 44 to 46 may be referred to as a "P-type active region". In an embodiment, each of the first to third active regions 41 to 43 may include a monocrystalline silicon layer having N-type impurities. Each of the fourth to sixth active regions 44 to 46 may include a monocrystalline silicon layer having P-type impurities.

The interface dielectric layer 47 may include a silicon oxide formed using a thermal oxidation process or a cleaning process. The interface dielectric layer 47 may be omitted. The first gate dielectric layer 48 may include high-k dielectrics. The first gate dielectric layer 48 may include Hf, O, and N. The first gate dielectric layer 48 may include HfON. The second gate dielectric layer 49 may include high-k dielectrics containing La. The second gate dielectric layer 49 may include Hf, La, O, and N. The second gate dielectric layer 49 may include HfLaON. In an embodiment, the second gate dielectric layer 49 may be referred to as a "first gate dielectric layer", and the first gate dielectric layer 48 may be referred to as a "second gate dielectric layer".

The first layer 61 may include TiON. The second layer 62 may include TiN or TiON. The third layer 63 may include TiON. The fourth layer 64 may include TiN. The fifth layer 65 may include TiAlC. The first gate conductive layer 72 may include TiN. The second gate conductive layer 74 may include W.

Referring to FIG. 2, the semiconductor devices according to example embodiments of the disclosure may include a substrate 21 having a first area LP, a second area SP, a third area RP, a fourth area RN, a fifth area SN, and a sixth area LN.

A plurality of first transistors TR1 may be disposed within the first area LP. For example, a first active region 41 may be defined in the substrate 21 within the first area LP. A plurality of first gate electrodes G1 may be disposed across the first active region 41. The first active region 41 and the plurality of first gate electrodes G1 may constitute the plurality of first transistors TR1. A plurality of second transistors TR2 may be disposed within the second area SP. For example, a second active region 42 may be defined in the substrate 21 within the second area SP. A plurality of second gate electrodes G2 may be disposed across the second active region 42. The second active region 42 and the plurality of second gate electrodes G2 may constitute the plurality of second transistors TR2. A plurality of third transistors TR3 may be disposed within the third area RP. For example, a third active region 43 may be defined in the substrate 21 within the third area RP. A plurality of third gate electrodes G3 may be disposed across the third active region 43. The third active region 43 and the plurality of third gate electrodes G3 may constitute the plurality of third transistors TR3.

A plurality of fourth transistors TR4 may be disposed within the fourth area RN. For example, a fourth active region 44 may be defined in the substrate 21 within the fourth area RN. A plurality of fourth gate electrodes G4 may be disposed across the fourth active region 44. The fourth active region 44 and the plurality of fourth gate electrodes G4 may constitute the plurality of fourth transistors TR4. A plurality of fifth transistors TR5 may be disposed within the fifth area SN. For example, a fifth active region 45 may be defined in the substrate 21 within the fifth area SN. A plurality of fifth gate electrodes G5 may be disposed across the fifth active region 45. The fifth active region 45 and the plurality of fifth gate electrodes G5 may constitute the plurality of fifth transistors TR5. A plurality of sixth transistors TR6 may be disposed within the sixth area LN. For example, a sixth active region 46 may be defined in the substrate 21 within the sixth area LN. A plurality of sixth gate electrodes G6 may be disposed across the sixth active region 46. The sixth active region 46 and the plurality of sixth gate electrodes G6 may constitute the plurality of sixth transistors TR6.

Each of the plurality of first to sixth transistors TR1, TR2, TR3, TR4, TR5 and TR6 may include a fin field effect transistor (finFET), a multi-bridge channel transistor such as MBCFET®, a nano-wire transistor, a vertical transistor, a recess channel transistor, a 3-D transistor, a planar transistor, or a combination thereof. In an embodiment, each of the plurality of first to third transistors TR1, TR2 and TR3 may be a PMOS transistor. In an embodiment, each of the plurality of fourth to sixth transistors TR4, TR5 and TR6 may be an NMOS transistor.

Each of the plurality of first transistors TR1 may have a first threshold voltage. Each of the plurality of second transistors TR2 may have a second threshold voltage different from the first threshold voltage. Each of the plurality of third transistors TR3 may have a third threshold voltage different from the first threshold voltage. An absolute value of the second threshold voltage may be smaller than an absolute value of the first threshold voltage. An absolute value of the third threshold voltage may be greater than the absolute value of the first threshold voltage. For example, the first threshold voltage may be about −220 mV. The second threshold voltage may be about −150 mV. The third threshold voltage may be about −300 mV.

Each of the plurality of fourth transistors TR4 may have a fourth threshold voltage different from the first threshold voltage. Each of the plurality of fifth transistors TR5 may have a fifth threshold voltage different from the fourth threshold voltage. Each of the plurality of sixth transistors TR6 may have a sixth threshold voltage different from the fourth threshold voltage. The fourth threshold voltage may be higher than the sixth threshold voltage. The fifth threshold voltage may be lower than the sixth threshold voltage. For example, the fourth threshold voltage may be about 320 mV. The fifth threshold voltage may be about 180 mV. The sixth threshold voltage may be about 250 mV.

Again referring to FIGS. 1 and 2, in an embodiment, the plurality of sixth transistors TR6 may be referred to as a "plurality of second transistors". The plurality of second transistors TR2 may be referred to as a "plurality of third transistors". The plurality of third transistors TR3 may be referred to as a "plurality of fourth transistors". The plurality of fourth transistors TR4 may be referred to as a "plurality of fifth transistors". The plurality of fifth transistors TR5 may be referred to as a "plurality of sixth transistors". The plurality of sixth gate electrodes G6 may be referred to as a "plurality of second gate electrodes". The plurality of second gate electrodes G2 may be referred to as a "plurality of third gate electrodes". The plurality of third gate electrodes G3 may be referred to as a "plurality of fourth gate electrodes". The plurality of fourth gate electrodes G4 may be referred to as a "plurality of fifth gate electrodes". The plurality of fifth gate electrodes G5 may be referred to as a "plurality of sixth gate electrodes".

The first active region 41 may be referred to as a "first N-type active region". The second active region 42 may be referred to as a "second N-type active region". The third active region 43 may be referred to as a "third N-type active region". The sixth active region 46 may be referred to as a "first P-type active region". The fourth active region 44 may be referred to as a "second P-type active region". The fifth active region 45 may be referred to as a "third P-type active region". The sixth work function layer WF6 may be referred to as a "second work function layer". The second work function layer WF2 may be referred to as a "third work function layer". The third work function layer WF3 may be referred to as a "fourth work function layer". The fourth work function layer WF4 may be referred to as a "fifth work function layer". The fifth work function layer WF5 may be referred to as a "sixth work function layer".

Referring to FIG. 3, a pair of first source/drain regions 55 may be disposed within the first active region 41 adjacent to opposite sides of the first gate electrode G1. The pair of first source/drain regions 55 may be disposed within the second active region 42 adjacent to opposite sides of the second gate electrode G2. The pair of first source/drain regions 55 may be disposed within the third active region 43 adjacent to opposite sides of the third gate electrode G3. A pair of second source/drain regions 59 may be disposed within the fourth active region 44 adjacent to opposite sides of the fourth gate electrode G4. The pair of second source/drain regions 59 may be disposed within the fifth active region 45 adjacent to opposite sides of the fifth gate electrode G5. The pair of second source/drain regions 59 may be disposed within the sixth active region 46 adjacent to opposite sides of the sixth gate electrode G6. In an embodiment, each of the first to sixth gate electrodes G1 to G6 may correspond to a replacement metal gate electrode.

Referring to FIG. 4, an element isolation layer 23 may be disposed on the substrate 21 to define the first to sixth active regions 41 to 46. Each of the first to sixth active regions 41 to 46 may protrude to a level higher than an upper surface of the element isolation layer 23. The first gate electrode G1 may cover an upper surface and side surfaces of the first active region 41. The second gate electrode G2 may cover an upper surface and side surfaces of the second active region 42. The third gate electrode G3 may cover an upper surface and side surfaces of the third active region 43. The fourth gate electrode G4 may cover an upper surface and side surfaces of the fourth active region 44. The fifth gate electrode G5 may cover an upper surface and side surfaces of the fifth active region 45. The sixth gate electrode G6 may cover an upper surface and side surfaces of the sixth active region 46. Each of the first to sixth gate electrodes G1 to G6 may extend on the element isolation layer 23.

The substrate 21 may include a semiconductor substrate such as a silicon wafer. The element isolation layer 23 may include an insulating layer formed using a shallow trench isolation (STI) method. The element isolation layer 23 may include a silicon oxide, a silicon nitride, a silicon oxynitride, a silicon boron nitride (SiBN), a silicon carbon nitride (SiCN), low-k dielectrics, high-k dielectrics, or a combination thereof.

Referring to FIG. 5, the semiconductor devices according to example embodiments of the disclosure may include a substrate 21, an element isolation layer 23, a first active region 41, an interface dielectric layer 47, a second gate dielectric layer 49, a pair of first source/drain regions 55, a first gate electrode G1, a gate capping layer 76, a gate spacer 78, and an interlayer insulating layer 79.

An upper surface of the element isolation layer 23 may be formed at a level lower than an uppermost end of the first active region 41. The first active region 41 may protrude to a level higher than the upper surface of the element isolation layer 23. The first active region 41 may include monocrystalline silicon having N-type impurities. The N-type impurities may include P, As, or a combination thereof. The first active region 41 may be referred to as a "first N-type active region".

The pair of first source/drain regions 55 may be disposed within the first active region 41 adjacent to opposite sides of the first gate electrode G1. Uppermost ends of the pair of first source/drain regions 55 may protrude to a level higher than the uppermost end of the first active region 41. Each of the pair of first source/drain regions 55 may include a semiconductor layer having P-type impurities. The P-type impurities may include B, BF, or a combination thereof. Each of the pair of first source/drain regions 55 may include an SiGe layer formed using a selective epitaxial growth (SEG) method. Each of the pair of first source/drain regions 55 may include a first lower drain 51, a first intermediate drain 52, and a first upper drain 53.

The first lower drain 51 may directly contact the first active region 41. The first intermediate drain 52 may be disposed on the first lower drain 51. The first upper drain 53 may be disposed on the first intermediate drain 52. The weight ratio of Ge of the first lower drain 51 may be smaller than that of the first intermediate drain 52. In an embodiment, the first lower drain 51 may be an Si layer. The weight ratio of Ge of the first intermediate drain 52 may be greater than those of the first lower drain 51 and the first upper drain 53. The weight ratio of Ge of the first upper drain 53 may be smaller than that of the first intermediate drain 52. In an embodiment, the first upper drain 53 may be an Si layer.

The first gate electrode G1 may include a first work function layer WF1, a first gate conductive layer 72 and a second gate conductive layer 74 which are sequentially stacked. The first work function layer WF1 may include a first layer 61, a second layer 62, a third layer 63, a fourth layer 64 and a fifth layer 65 which are sequentially stacked. The first layer 61 may directly contact the second gate dielectric layer 49.

The first work function layer WF1 may cover an upper surface and side surfaces of the first active region 41. The first work function layer WF1 may extend on the element isolation layer 23. A lowermost end of the first work function layer WF1 may be disposed at a level lower than an uppermost end of the first active region 41. The lowermost end of the first work function layer WF1 may be disposed nearer to a lower surface of the substrate than to the uppermost end of the first active region 41.

The interface dielectric layer 47 may be formed on the upper surface and the side surfaces of the first active region 41. The interface dielectric layer 47 may be interposed between the first work function layer WF1 and the first active region 41. The second gate dielectric layer 49 may be disposed between the first work function layer WF1 and the interface dielectric layer 47. The second gate dielectric layer 49 may extend between the first work function layer WF1 and the element isolation layer 23.

The gate capping layer 76 may cover the first gate electrode G1. The gate spacer 78 may be disposed on side walls of the gate capping layer 76 and the first gate electrode G1. The interlayer insulating layer 79 may be disposed on the pair of first source/drain regions 55. Each of the gate spacer 78 and the interlayer insulating layer 79 may include a silicon oxide, a silicon nitride, a silicon oxynitride, a silicon boron nitride (SiBN), a silicon carbon nitride (SiCN), low-k dielectrics, high-k dielectrics, or a combination thereof. For example, the gate spacer 78 may include a silicon nitride. The interlayer insulating layer 79 may include a silicon oxide or low-k dielectrics.

The second gate dielectric layer 49 may extend between the first gate electrode G1 and the gate spacer 78. The second gate dielectric layer 49 may extend on side surfaces of the first work function layer WF1.

Referring to FIG. 6, the semiconductor devices according to example embodiments of the disclosure may include a substrate 21, an element isolation layer 23, a second active region 42, an interface dielectric layer 47, a first gate dielectric layer 48, a pair of first source/drain regions 55, a second gate electrode G2, a gate capping layer 76, a gate spacer 78, and an interlayer insulating layer 79. In the following description, only differences will be briefly described.

The second active region 42 may be referred to as a "second N-type active region". A first lower drain 51 may directly contact the second active region 42. The second gate electrode G2 may include a second work function layer WF2, a first gate conductive layer 72 and a second gate conductive layer 74 which are sequentially stacked. The second work function layer WF2 may include a first layer

61, a second layer 62, a third layer 63, a fourth layer 64, and a fifth layer 65. The first layer 61 may directly contact the first gate dielectric layer 48.

Referring to FIG. 7, the semiconductor devices according to example embodiments of the disclosure may include a substrate 21, an element isolation layer 23, a third active region 43, an interface dielectric layer 47, a second gate dielectric layer 49, a pair of first source/drain regions 55, a third gate electrode G3, a gate capping layer 76, a gate spacer 78, and an interlayer insulating layer 79.

The third active region 43 may be referred to as a "third N-type active region". A first lower drain 51 may directly contact the third active region 43. The third gate electrode G3 may include a third work function layer WF3, a first gate conductive layer 72 and a second gate conductive layer 74 which are sequentially stacked. The third work function layer WF3 may include a third layer 63, a fourth layer 64 and a fifth layer 65 which are sequentially stacked. The third layer 63 may directly contact the second gate dielectric layer 49.

Referring to FIG. 8, the semiconductor devices according to example embodiments of the disclosure may include a substrate 21, an element isolation layer 23, a fourth active region 44, an interface dielectric layer 47, a second gate dielectric layer 49, a pair of second source/drain regions 59, a fourth gate electrode G4, a gate capping layer 76, a gate spacer 78, and an interlayer insulating layer 79.

The fourth active region 44 may include monocrystalline silicon having P-type impurities. The fourth active region 44 may be referred to as a "second P-type active region". Each of the pair of second source/drain regions 59 may include a semiconductor layer having N-type impurities. Each of the pair of second source/drain regions 59 may include an Si layer or an SiC layer formed using a selective epitaxial growth (SEG) method. Each of the pair of second source/drain regions 59 may include a second lower drain 56, a second intermediate drain 57, and a second upper drain 58.

The second lower drain 56 may directly contact the fourth active region 44. The fourth gate electrode G4 may include a fourth work function layer WF4, a first gate conductive layer 72 and a second gate conductive layer 74 which are sequentially stacked. The fourth work function layer WF4 may include a fourth layer 64 and a fifth layer 65 which are sequentially stacked. The fourth layer 64 may directly contact the second gate dielectric layer 49.

Referring to FIG. 9, the semiconductor devices according to example embodiments of the disclosure may include a substrate 21, an element isolation layer 23, a fifth active region 45, an interface dielectric layer 47, a second gate dielectric layer 49, a pair of second source/drain regions 59, a fifth gate electrode G5, a gate capping layer 76, a gate spacer 78, and an interlayer insulating layer 79.

The fifth active region 45 may be referred to as a "third P-type active region". Each of the pair of second source/drain regions 59 may include a semiconductor layer having N-type impurities. The second lower drain 56 may directly contact the fifth active region 45. The fifth gate electrode G5 may include a fifth work function layer WF5, a first gate conductive layer 72 and a second gate conductive layer 74 which are sequentially stacked. The fifth work function layer WF5 may include a fifth layer 65. The fifth layer 65 may directly contact the second gate dielectric layer 49.

Referring to FIG. 10, the semiconductor devices according to example embodiments of the disclosure may include a substrate 21, an element isolation layer 23, a fifth active region 45, an interface dielectric layer 47, a first gate dielectric layer 48, a pair of second source/drain regions 59, a sixth gate electrode G6, a gate capping layer 76, a gate spacer 78, and an interlayer insulating layer 79.

The sixth active region 46 may be referred to as a "first P-type active region". Each of the pair of second source/drain regions 59 may include a semiconductor layer having N-type impurities. The second lower drain 56 may directly contact the sixth active region 46. The sixth gate electrode G6 may include a sixth work function layer WF6, a first gate conductive layer 72 and a second gate conductive layer 74 which are sequentially stacked. The sixth work function layer WF6 may include a fifth layer 65. The fifth layer 65 may directly contact the first gate dielectric layer 48.

The sixth work function layer WF6 may cover an upper surface and side surfaces of the sixth active region 46. The sixth work function layer WF6 may extend on the element isolation layer 23. The first gate dielectric layer 48 may be disposed between the sixth work function layer WF6 and the interface dielectric layer 47. The first gate dielectric layer 48 may extend between the sixth work function layer WF6 and the element isolation layer 23. The first gate dielectric layer 48 may extend between the sixth gate electrode G6 and the gate spacer 78. The first gate dielectric layer 48 may extend on side surfaces of the sixth work function layer WF6.

Figure 11:
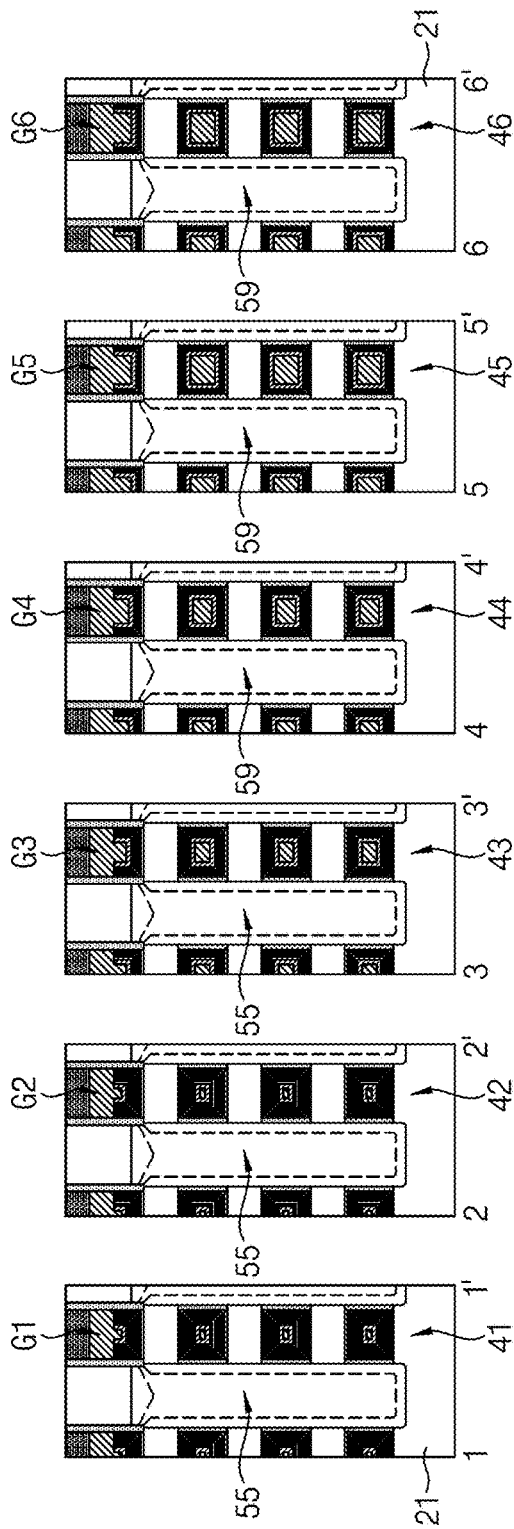
Figure 12:
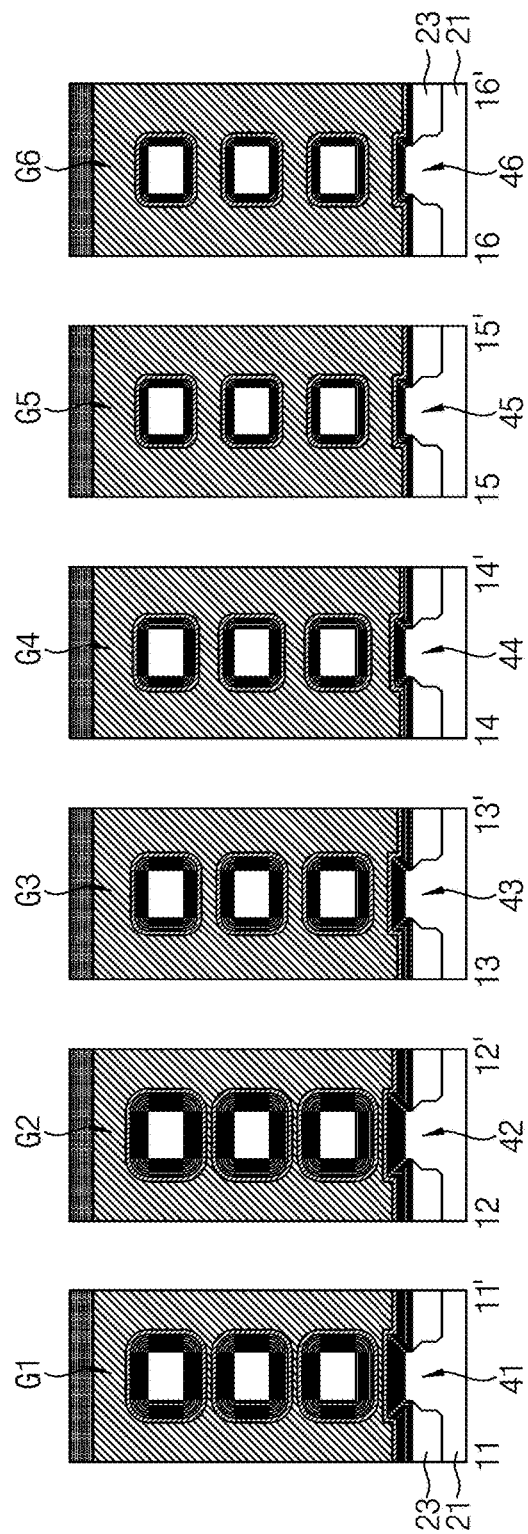
Figure 13:
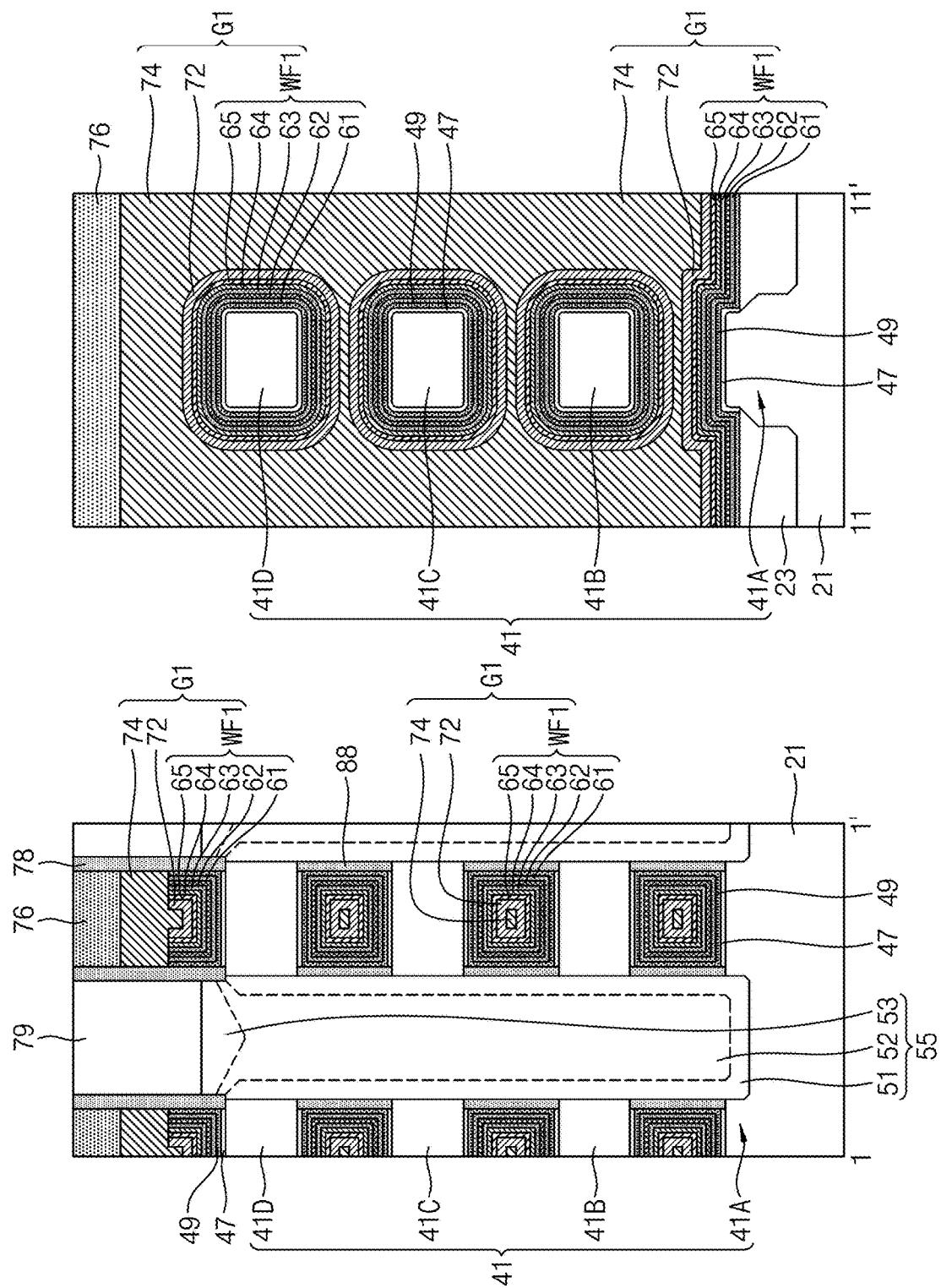
Figure 14:
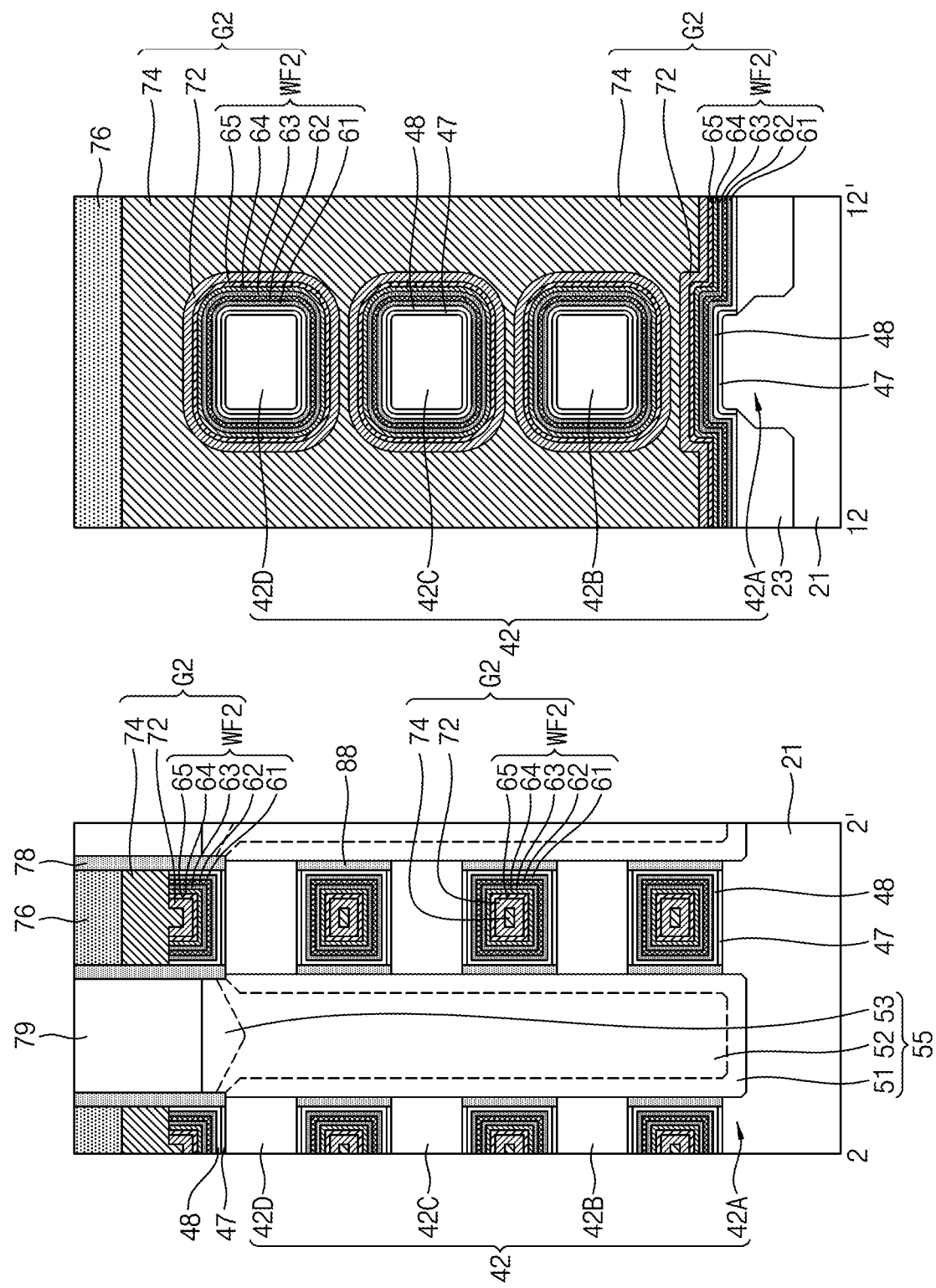
Figure 15:
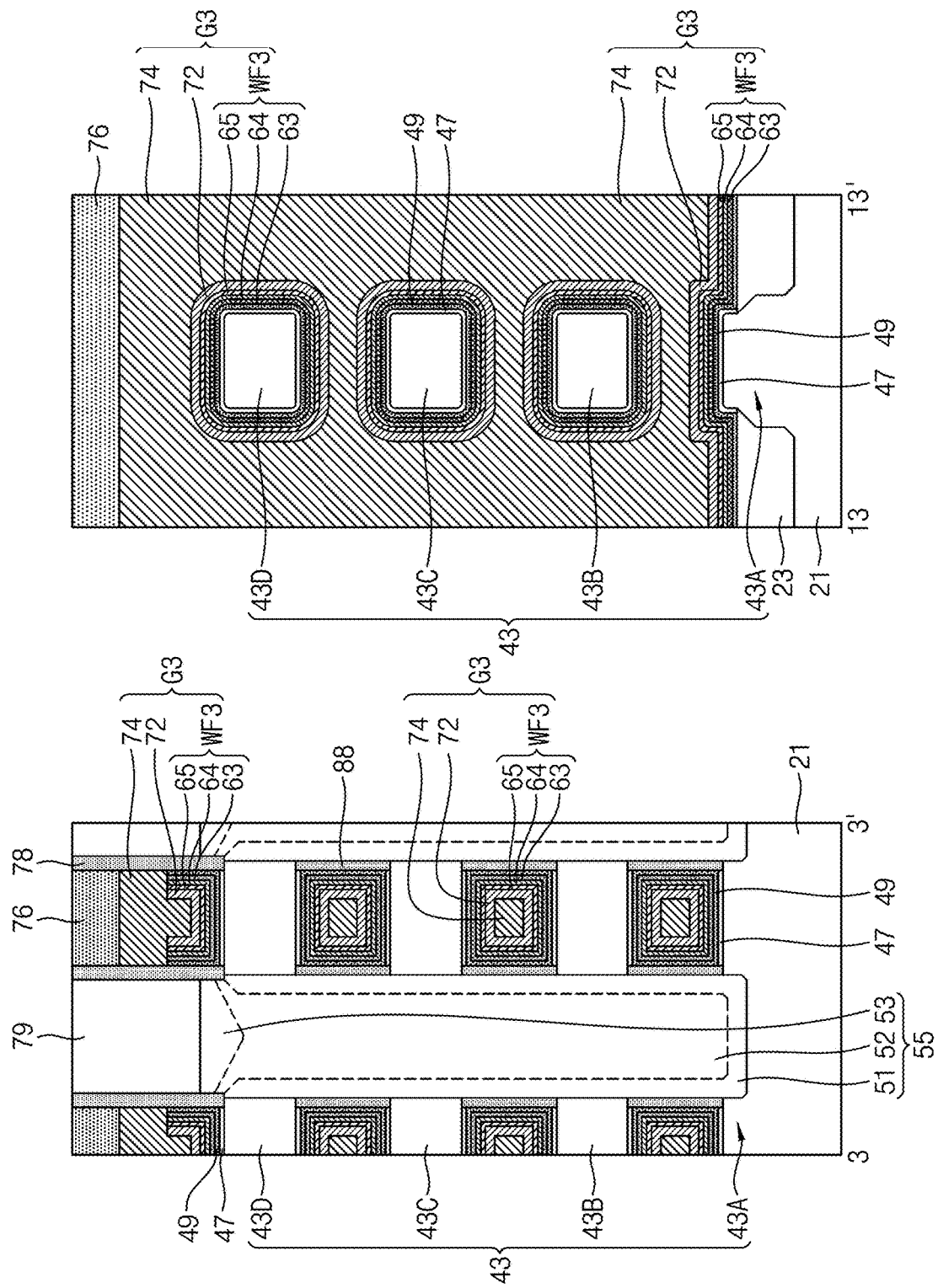
Figure 16:
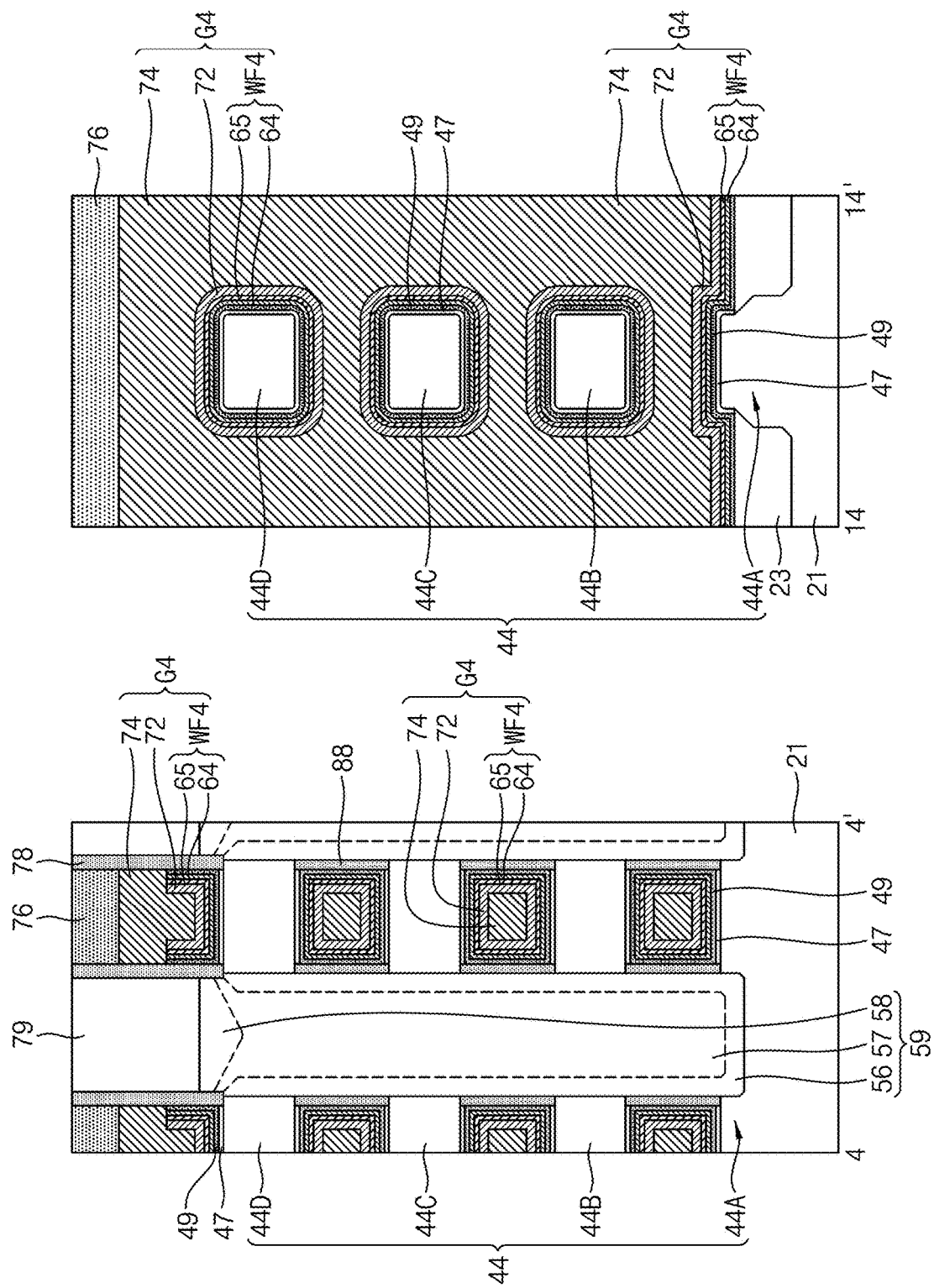
Figure 17:
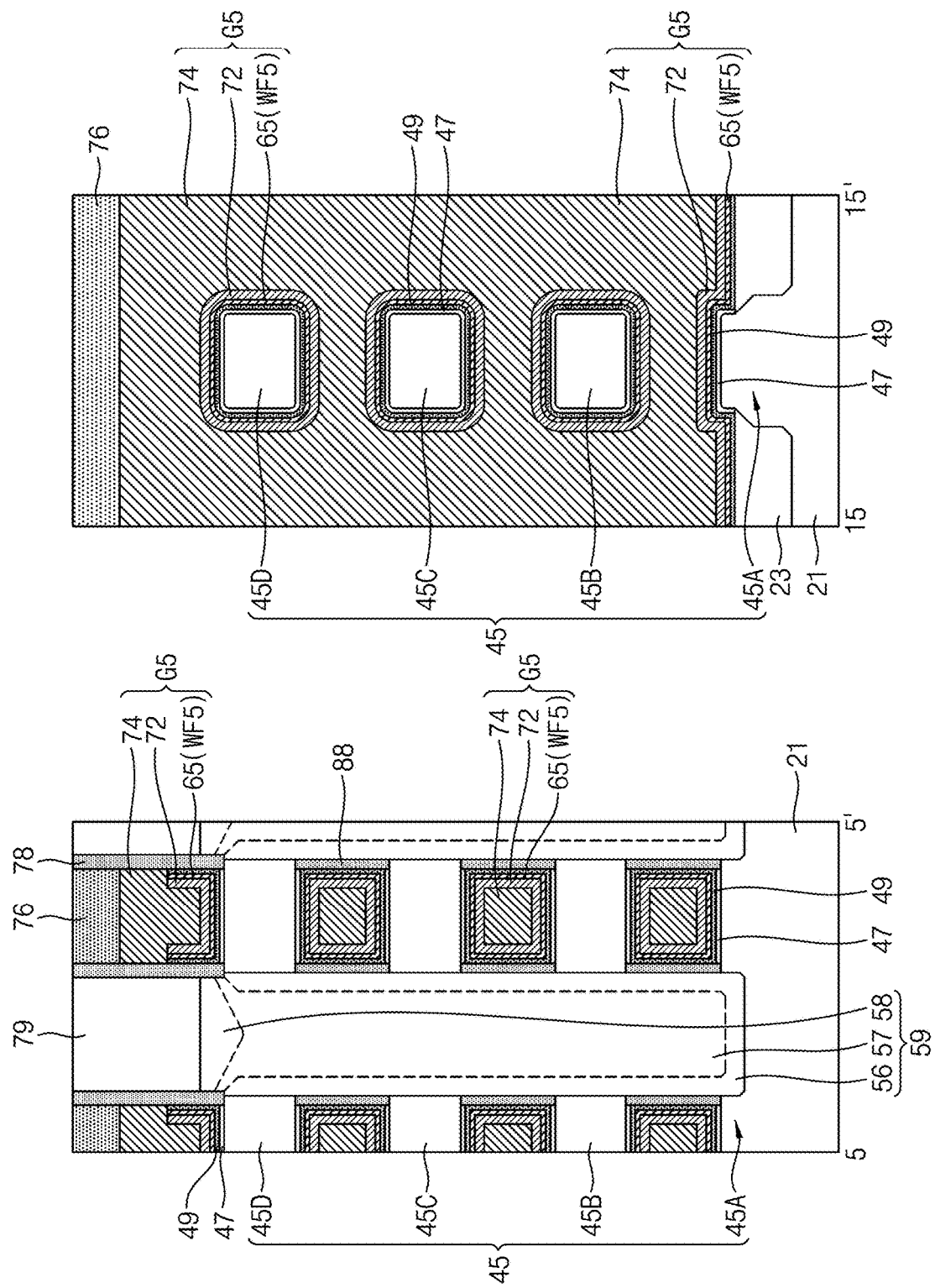
Figure 18:
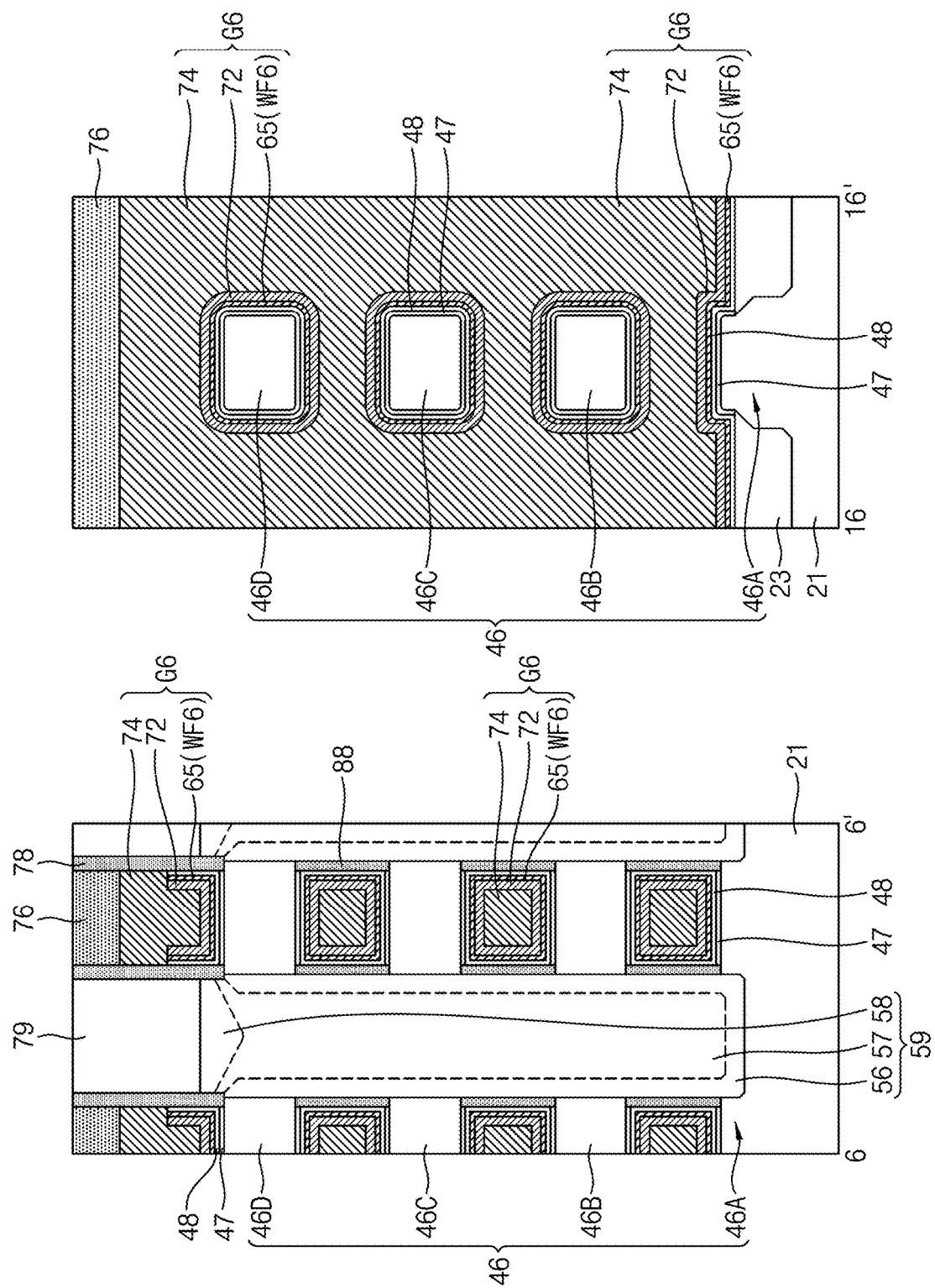

FIG. 11 is cross-sectional views taken along lines 1-1', 2-2', 3-3', 4-4', 5-5' and 6-6' in FIG. 2. FIG. 12 is cross-sectional views taken along lines 11-11', 12-12', 13-13', 14-14', 15-15' and 16-16' in FIG. 2. FIG. 13 is cross-sectional views taken along lines 1-1' and 11-11' in FIG. 2. FIG. 14 is cross-sectional views taken along lines 2-2' and 12-12' in FIG. 2. FIG. 15 is cross-sectional views taken along lines 3-3' and 13-13' in FIG. 2. FIG. 16 is cross-sectional views taken along lines 4-4' and 14-14' in FIG. 2. FIG. 17 is cross-sectional views taken along lines 5-5' and 15-15' in FIG. 2. FIG. 18 is cross-sectional views taken along lines 6-6' and 16-16' in FIG. 2.

Referring to FIG. 11, the semiconductor devices according to example embodiments of the disclosure may include a substrate 21, first to sixth active regions 41 to 46, a plurality of first and second source/drain regions 55 and 59, and first to sixth gate electrodes G1 to G6. In an embodiment, each of the first to sixth gate electrodes G1 to G6 may correspond to a replacement metal gate electrode.

Referring to FIG. 12, the semiconductor devices according to example embodiments of the disclosure may include a substrate 21, an element isolation layer 23, first to sixth active regions 41 to 46, and first to sixth gate electrodes G1 to G6.

Referring to FIG. 13, the semiconductor devices according to example embodiments of the disclosure may include a substrate 21, an element isolation layer 23, a first active region 41, an interface dielectric layer 47, a second gate dielectric layer 49, a pair of first source/drain regions 55, a first gate electrode G1, a gate capping layer 76, a gate spacer 78, an interlayer insulating layer 79, and an inner spacer 88.

The first active region 41 may include a plurality of first active patterns 41A, 41B, 41C and 41D. The plurality of first active patterns 41A, 41B, 41C and 41D may be vertically aligned on the substrate 21. One of the plurality of first active patterns 41A, 41B, 41C and 41D, which is disposed at a lowermost side, that is, the first active pattern 41A, may be defined within the substrate 21 by the element isolation layer 23. The plurality of first active patterns 41A, 41B, 41C and 41D may be spaced apart from one another. The first active region 41 may be referred to as a "first N-type active region". The plurality of first active patterns 41A, 41B, 41C and 41D may be referred to as a "plurality of first N-type active patterns".

The pair of first source/drain regions 55 may be disposed within the first active region 41 adjacent to opposite sides of the first gate electrode G1. The first gate electrode G1 may include a first work function layer WF1, a first gate conductive layer 72, and a second gate conductive layer 74. The first gate electrode G1 may cover an upper surface and side surfaces of the first active pattern 41A disposed at the lowermost side from among the plurality of first active patterns 41A, 41B, 41C and 41D. The first gate electrode G1 may surround upper surfaces, lower surfaces and side surfaces of the remaining first active patterns 41B, 41C and 41D, except for the first active pattern 41A disposed at the lowermost side from among the plurality of first active patterns 41A, 41B, 41C and 41D.

The inner spacer 88 may be interposed between first gate electrode G1 and the pair of first source/drain regions 55. The inner spacer 88 may include a silicon oxide, a silicon nitride, a silicon oxynitride, low-k dielectrics, high-k dielectrics, or a combination thereof. For example, the inner spacer 88 may include a silicon nitride. The inner spacer 88 may be omitted.

The first work function layer WF1 may include a first layer 61, a second layer 62, a third layer 63, a fourth layer 64 and a fifth layer 65 which are sequentially stacked. The first layer 61 may directly contact the second gate dielectric layer 49. The first work function layer WF1 may cover the upper surface and the side surfaces of the first active pattern 41A disposed at the lowermost side from among the plurality of first active patterns 41A, 41B, 41C and 41D. The first work function layer WF1 may surround the upper surfaces, the lower surfaces and the side surfaces of the remaining first active patterns 41B, 41C and 41D, except for the first active pattern 41A disposed at the lowermost side from among the plurality of first active patterns 41A, 41B, 41C and 41D.

The interface dielectric layer 47 may be formed on the first active region 41. The interface dielectric layer 47 may be interposed between the first work function layer WF1 and the first active region 41. The second gate dielectric layer 49 may be disposed between the first work function layer WF1 and the interface dielectric layer 47. The second gate dielectric layer 49 may extend between the first work function layer WF1 and the element isolation layer 23. The second gate dielectric layer 49 may extend between the first work function layer WF1 and the inner spacer 88.

Referring to FIG. 14, the semiconductor devices according to example embodiments of the disclosure may include a substrate 21, an element isolation layer 23, a second active region 42, an interface dielectric layer 47, a first gate dielectric layer 48, a pair of first source/drain regions 55, a second gate electrode G2, a gate capping layer 76, a gate spacer 78, an interlayer insulating layer 79, and an inner spacer 88.

The second active region 42 may include a plurality of second active patterns 42A, 42B, 42C and 42D. The second active region 42 may be referred to as a "second N-type active region". The plurality of second active patterns 42A, 42B, 42C and 42D may be referred to as a "plurality of second N-type active patterns". The second gate electrode G2 may include a second work function layer WF2, a first gate conductive layer 72 and a second gate conductive layer 74 which are sequentially stacked. The second work function layer WF2 may include a first layer 61, a second layer 62, a third layer 63, a fourth layer 64 and a fifth layer 65 which are sequentially stacked. The first layer 61 may directly contact the first gate dielectric layer 48.

Referring to FIG. 15, the semiconductor devices according to example embodiments of the disclosure may include a substrate 21, an element isolation layer 23, a third active region 43, an interface dielectric layer 47, a second gate dielectric layer 49, a pair of first source/drain regions 55, a third gate electrode G3, a gate capping layer 76, a gate spacer 78, an interlayer insulating layer 79, and an inner spacer 88.

The third active region 43 may include a plurality of third active patterns 43A, 43B, 43C and 43D. The third active region 43 may be referred to as a "third N-type active region". The plurality of third active patterns 43A, 43B, 43C and 43D may be referred to as a "plurality of third N-type active patterns". The third gate electrode G3 may include a third work function layer WF3, a first gate conductive layer 72 and a second gate conductive layer 74 which are sequentially stacked. The third work function layer WF3 may include a third layer 63, a fourth layer 64 and a fifth layer 65 which are sequentially stacked. The third layer 63 may directly contact the second gate dielectric layer 49.

Referring to FIG. 16, the semiconductor devices according to example embodiments of the disclosure may include a substrate 21, an element isolation layer 23, a fourth active region 44, an interface dielectric layer 47, a second gate dielectric layer 49, a pair of second source/drain regions 59, a fourth gate electrode G4, a gate capping layer 76, a gate spacer 78, an interlayer insulating layer 79, and an inner spacer 88.

The fourth active region 44 may include a plurality of fourth active patterns 44A, 44B, 44C and 44D. The fourth active region 44 may be referred to as a "second P-type active region". The plurality of fourth active patterns 44A, 44B, 44C and 44D may be referred to as a "plurality of second P-type active patterns". The fourth gate electrode G4 may include a fourth work function layer WF4, a first gate conductive layer 72 and a second gate conductive layer 74 which are sequentially stacked. The fourth work function layer WF4 may include a fourth layer 64 and a fifth layer 65 which are sequentially stacked. The fourth layer 64 may directly contact the second gate dielectric layer 49.

Referring to FIG. 17, the semiconductor devices according to example embodiments of the disclosure may include a substrate 21, an element isolation layer 23, a fifth active region 45, an interface dielectric layer 47, a second gate dielectric layer 49, a pair of second source/drain regions 59, a fifth gate electrode G5, a gate capping layer 76, a gate spacer 78, an interlayer insulating layer 79, and an inner spacer 88.

The fifth active region 45 may include a plurality of fifth active patterns 45A, 45B, 45C and 45D. The fifth active region 45 may be referred to as a "third P-type active region". The plurality of fifth active patterns 45A, 45B, 45C and 45D may be referred to as a "plurality of third P-type active patterns". The fifth gate electrode G5 may include a fifth work function layer WF5, a first gate conductive layer 72 and a second gate conductive layer 74 which are sequentially stacked. The fifth work function layer WF5 may include a fifth layer 65. The fifth layer 65 may directly contact the second gate dielectric layer 49.

Referring to FIG. 18, the semiconductor devices according to example embodiments of the disclosure may include a substrate 21, an element isolation layer 23, a sixth active region 46, an interface dielectric layer 47, a first gate dielectric layer 48, a pair of second source/drain regions 59, a sixth gate electrode G6, a gate capping layer 76, a gate spacer 78, an interlayer insulating layer 79, and an inner spacer 88.

The sixth active region 46 may include a plurality of sixth active patterns 46A, 46B, 46C and 46D. The sixth active region 46 may be referred to as a "first P-type active region". The plurality of sixth active patterns 46A, 46B, 46C and 46D may be referred to as a "plurality of first P-type active patterns". The sixth gate electrode G6 may include a sixth work function layer WF6, a first gate conductive layer 72 and a second gate conductive layer 74 which are sequentially stacked. The sixth work function layer WF6 may include a fifth layer 65. The fifth layer 65 may directly contact the first gate dielectric layer 48.

Figure 19:
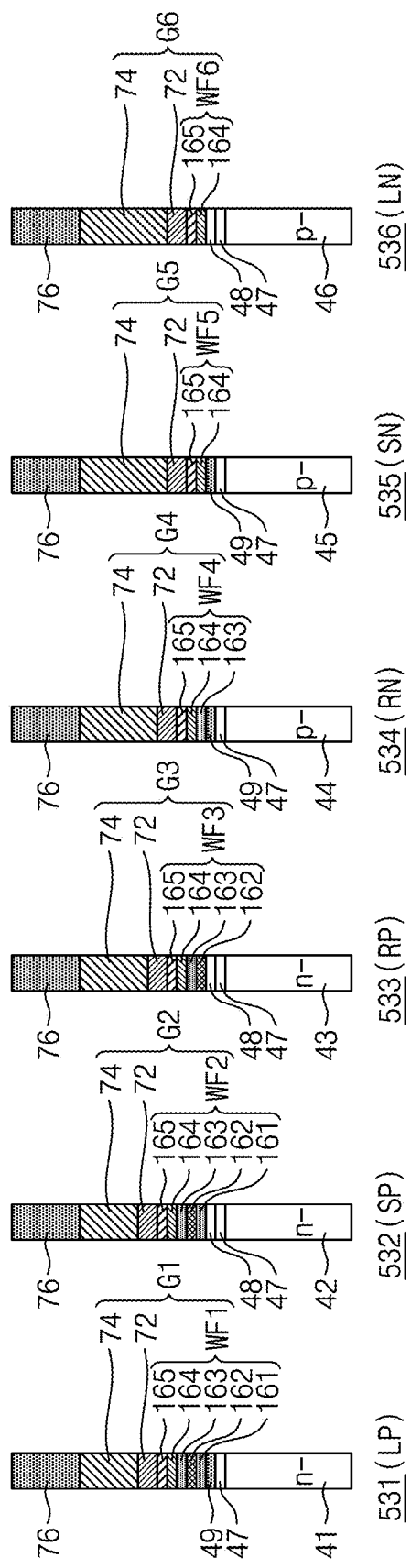
Figure 20:
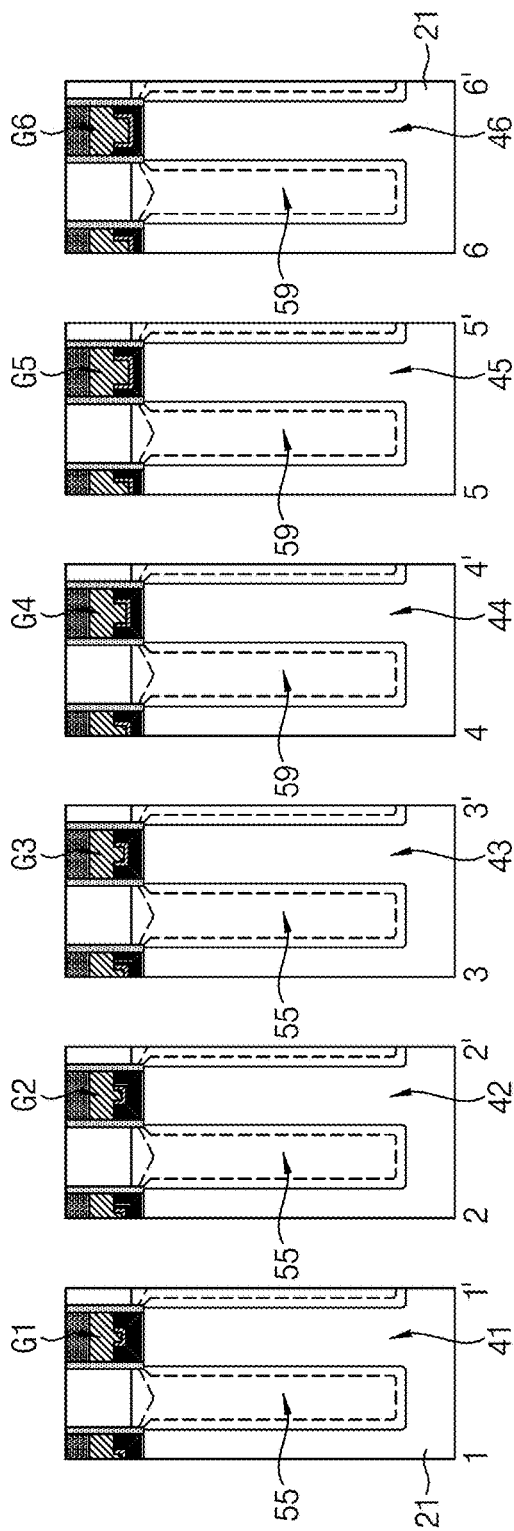
Figure 21:
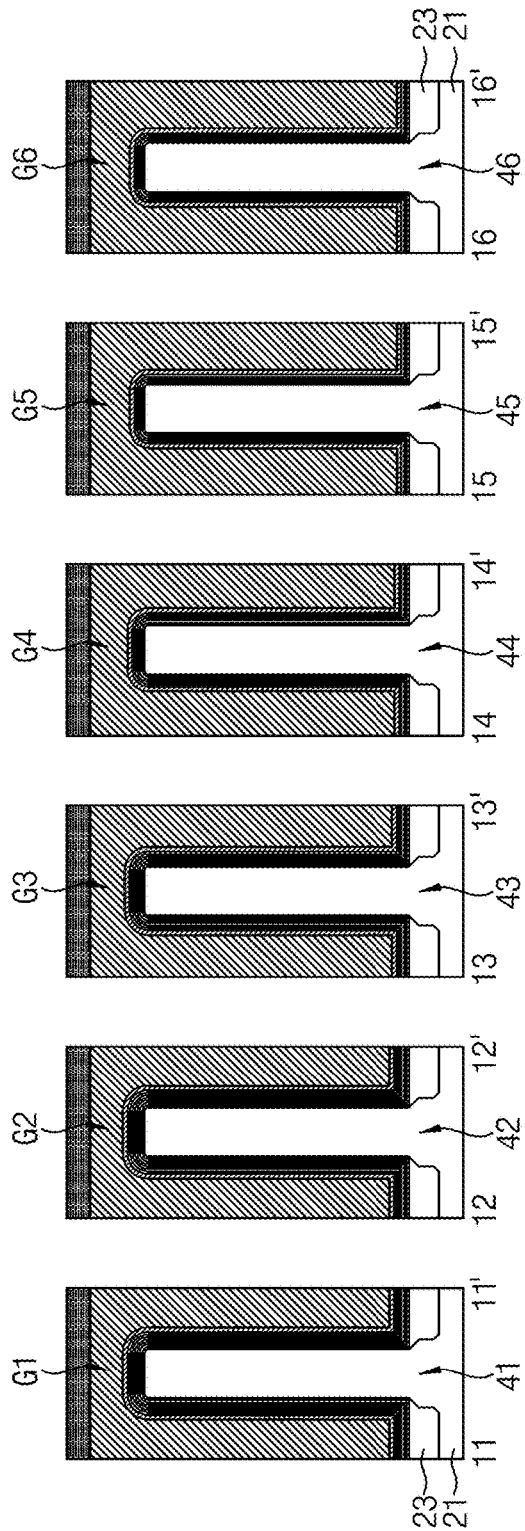
Figure 22:
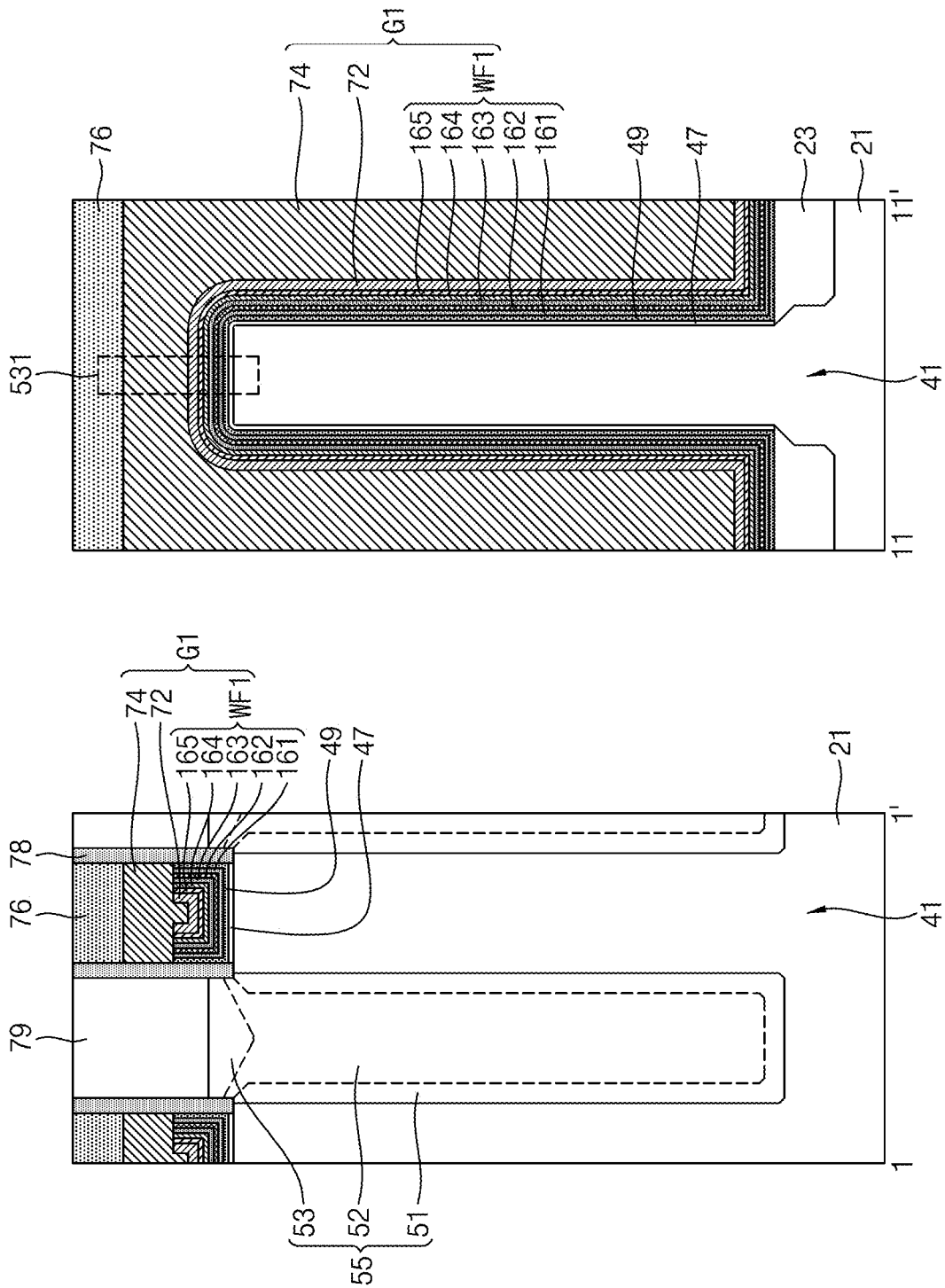
Figure 23:
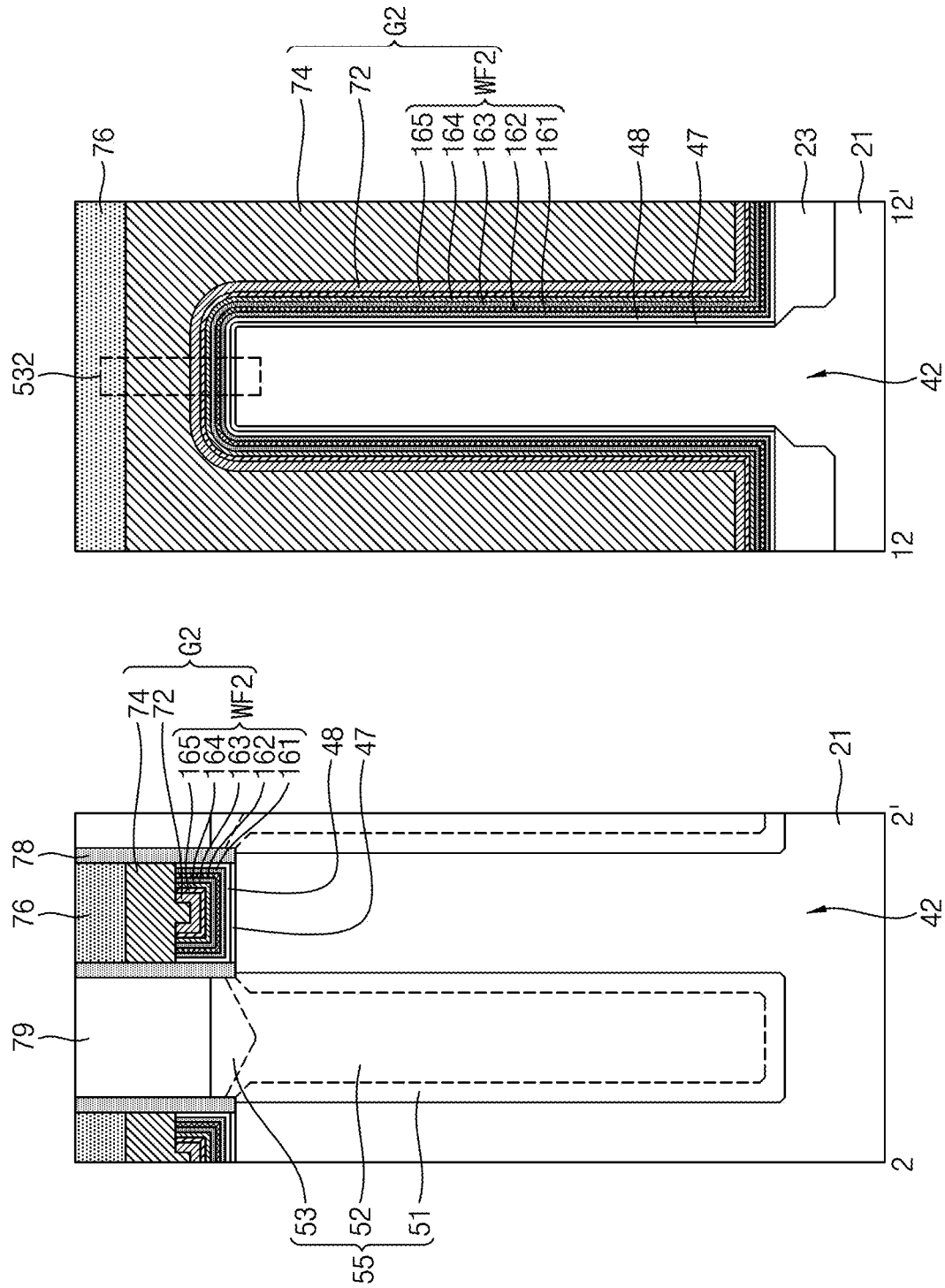
Figure 24:
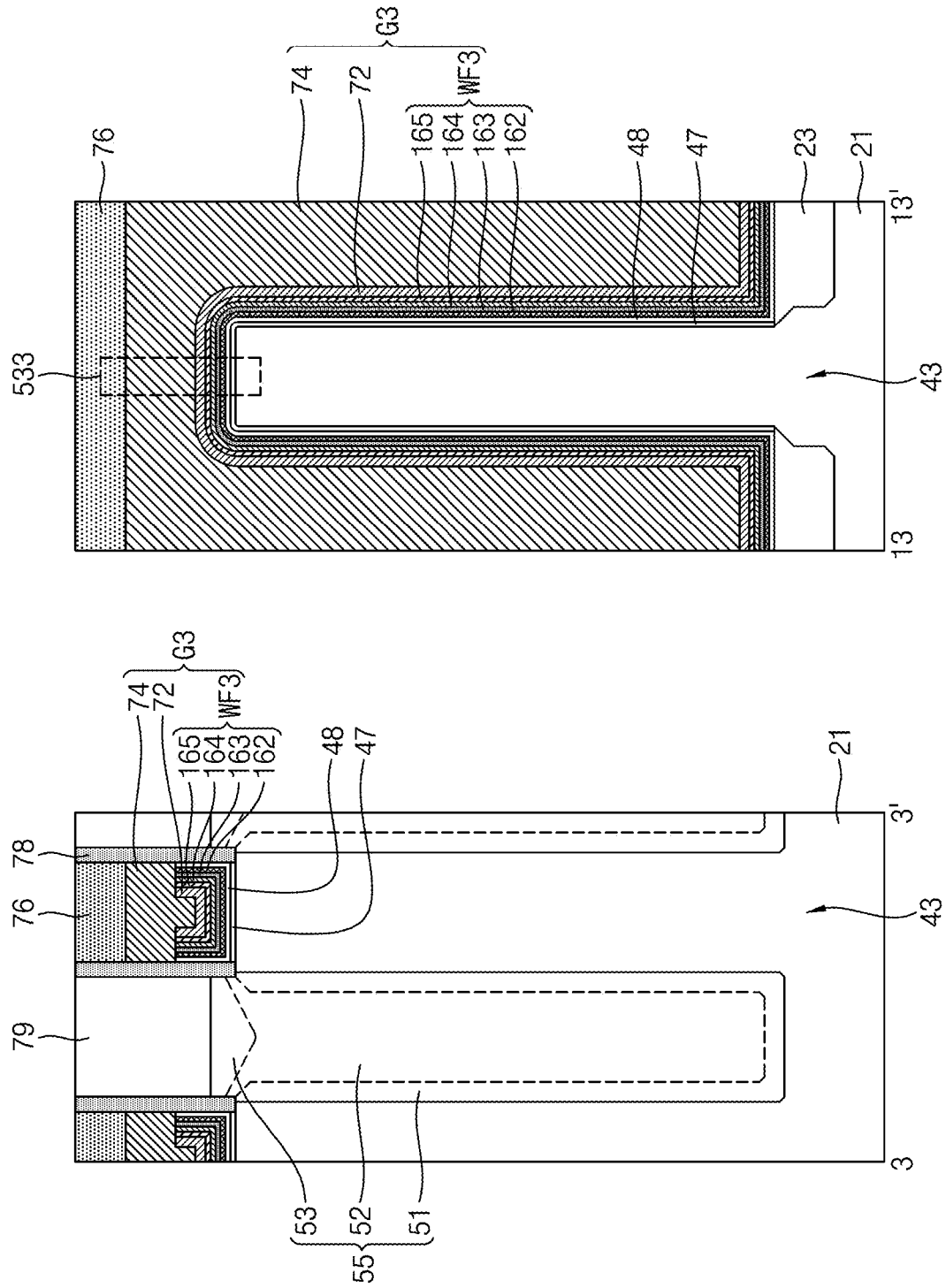
Figure 25:
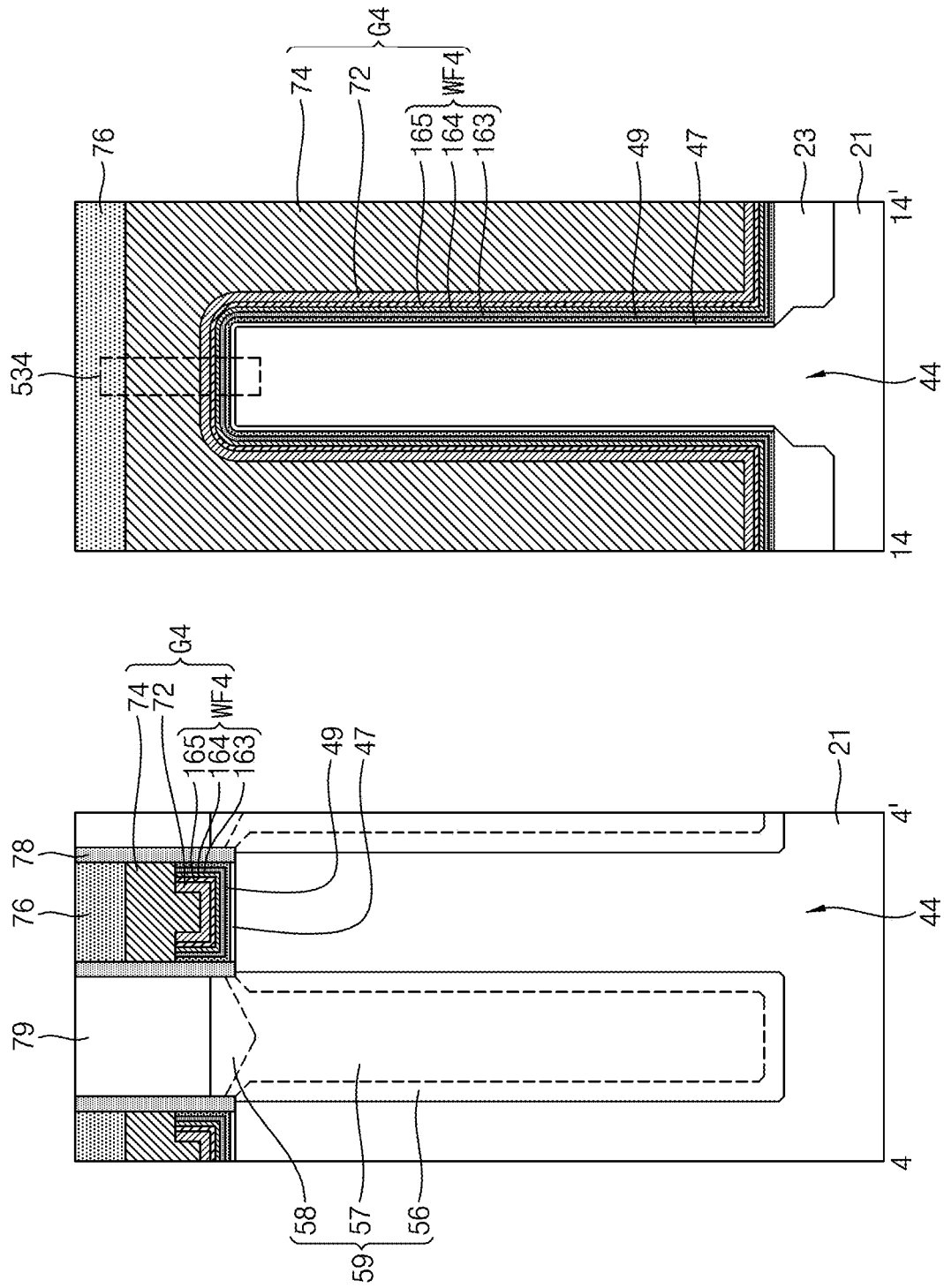
Figure 26:
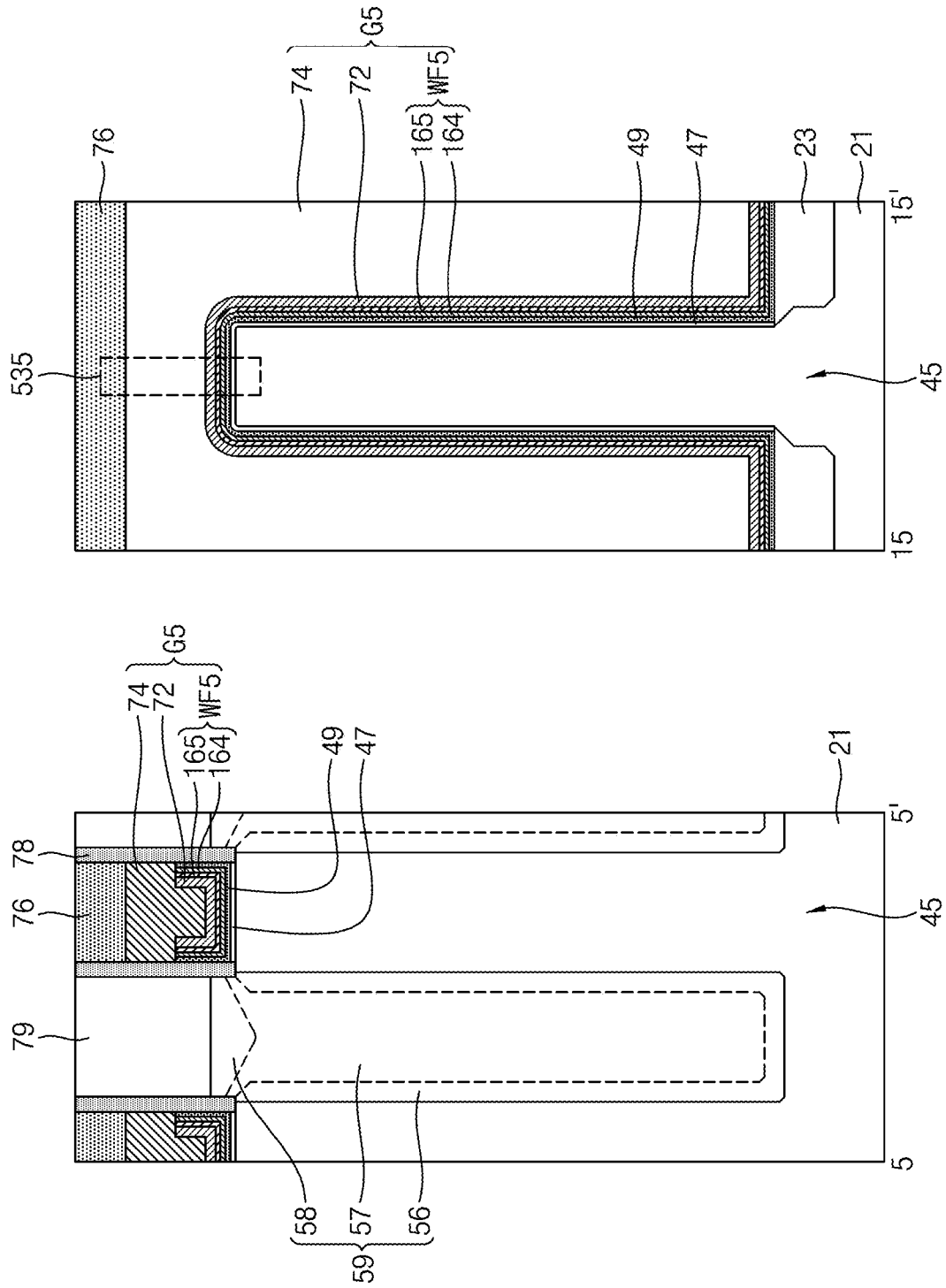
Figure 27:
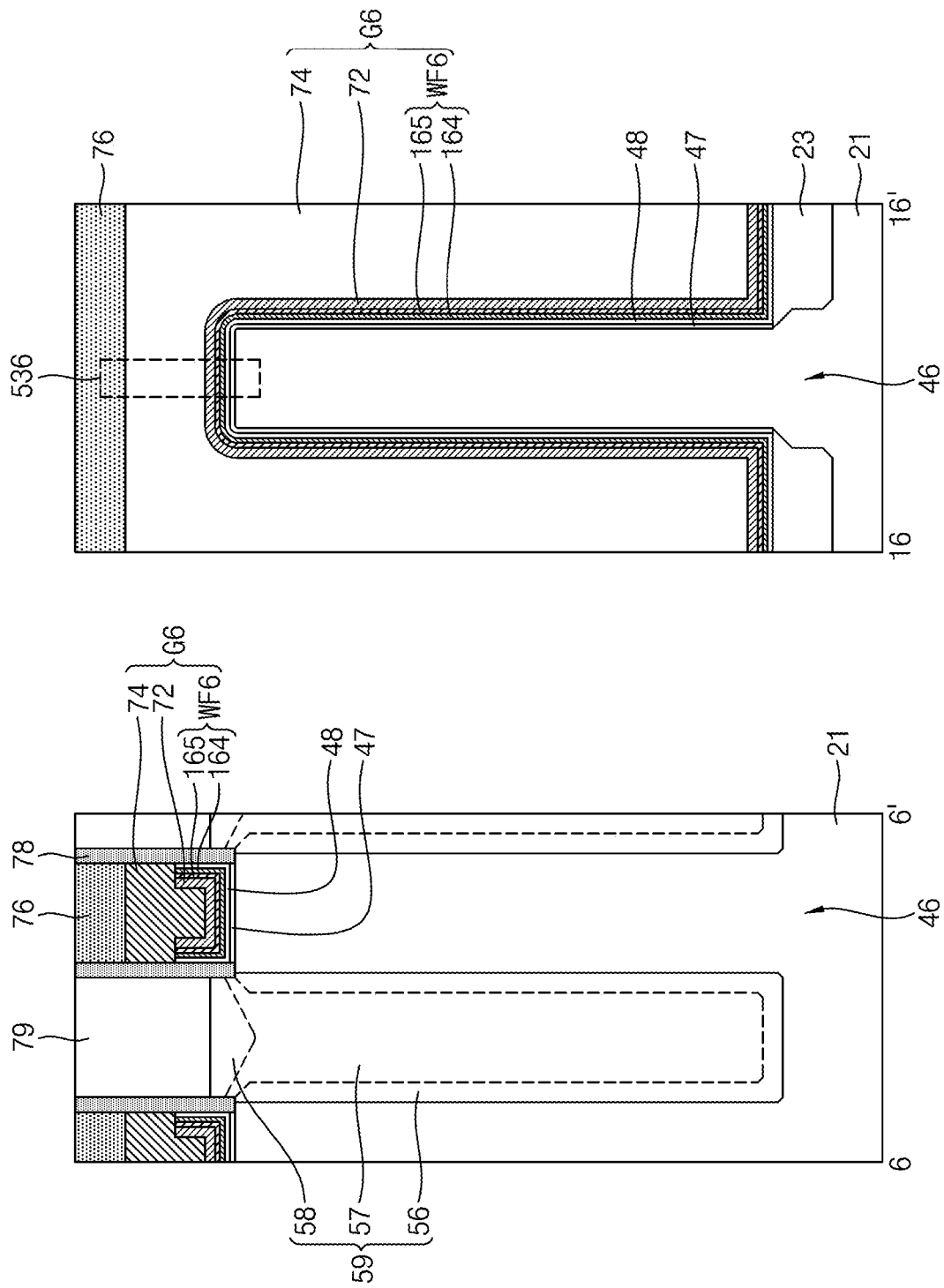

FIG. 19 is sectional views explaining semiconductor devices according to example embodiments of the disclosure. FIG. 20 is cross-sectional views taken along lines 1-1', 2-2', 3-3', 4-4', 5-5' and 6-6' in FIG. 2. FIG. 21 is cross-sectional views taken along lines 11-11', 12-12', 13-13', 14-14', 15-15' and 16-16' in FIG. 2. FIG. 22 is cross-sectional views taken along lines 1-1' and 11-11' in FIG. 2. FIG. 23 is cross-sectional views taken along lines 2-2' and 12-12' in FIG. 2. FIG. 24 is cross-sectional views taken along lines 3-3' and 13-13' in FIG. 2. FIG. 25 is cross-sectional views taken along lines 4-4' and 14-14' in FIG. 2. FIG. 26 is cross-sectional views taken along lines 5-5' and 15-15' in FIG. 2. FIG. 27 is cross-sectional views taken along lines 6-6' and 16-16' in FIG. 2. FIG. 19 may correspond to an enlarged view showing a first portion 531 of FIG. 22, a second portion 532 of FIG. 23, a third portion 533 of FIG. 24, a fourth portion 534 of FIG. 25, a fifth portion 535 of FIG. 26, and a sixth portion 536 of FIG. 27.

Referring to FIG. 19, the semiconductor devices according to example embodiments of the disclosure may include first to sixth active regions 41 to 46, an interface dielectric layer 47, a plurality of first and second gate dielectric layers 48 and 49, first to sixth gate electrodes G1 to G6, and a gate capping layer 76.

A first work function layer WF1 may include a first layer 161, a second layer 162, a third layer 163, a fourth layer 164 and a fifth layer 165 which are sequentially stacked. The first layer 161 may directly contact the second gate dielectric layer 49.

A second work function layer WF2 may include the first layer 161, the second layer 162, the third layer 163, the fourth layer 164 and the fifth layer 165 which are sequentially stacked. The first layer 161 may directly contact the first gate dielectric layer 48.

A third work function layer WF3 may include the second layer 162, the third layer 163, the fourth layer 164 and the fifth layer 165 which are sequentially stacked. The second layer 162 may directly contact the first gate dielectric layer 48.

A fourth work function layer WF4 may include the third layer 163, the fourth layer 164 and the fifth layer 165 which are sequentially stacked. The third layer 163 may directly contact the second gate dielectric layer 49.

A fifth work function layer WF5 may include the fourth layer 164 and the fifth layer 165 which are sequentially stacked. The fourth layer 164 may directly contact the second gate dielectric layer 49.

A sixth work function layer WF6 may include the fourth layer 164 and the fifth layer 165. The fourth layer 164 may directly contact the first gate dielectric layer 48.

The first layer 161 may include TiN. The second layer 162 may include TiN. The third layer 163 may include TiN. The fourth layer 164 may include TiN. The fifth layer 165 may include TiAlC.

Referring to FIG. 20, the semiconductor devices according to example embodiments of the disclosure may include a substrate 21, first to sixth active regions 41 to 46, a plurality of first and second source/drain regions 55 and 59, and first to sixth gate electrodes G1 to G6. In an embodiment, each of the first to sixth gate electrodes G1 to G6 may correspond to a replacement metal gate electrode.

Referring to FIG. 21, the semiconductor devices according to example embodiments of the disclosure may include a substrate 21, an element isolation layer 23, first to sixth active regions 41 to 46, and first to sixth gate electrodes G1 to G6.

Referring to FIG. 22, the semiconductor devices according to example embodiments of the disclosure may include a substrate 21, an element isolation layer 23, a first active region 41, an interface dielectric layer 47, a second gate dielectric layer 49, a pair of first source/drain regions 55, a first gate electrode G1, a gate capping layer 76, a gate spacer 78, and an interlayer insulating layer 79. A first layer 161 may directly contact the second gate dielectric layer 49.

Referring to FIG. 23, the semiconductor devices according to example embodiments of the disclosure may include a substrate 21, an element isolation layer 23, a second active region 42, an interface dielectric layer 47, a first gate dielectric layer 48, a pair of first source/drain regions 55, a second gate electrode G2, a gate capping layer 76, a gate spacer 78, and an interlayer insulating layer 79. A first layer 161 may directly contact the first gate dielectric layer 48.

Referring to FIG. 24, the semiconductor devices according to example embodiments of the disclosure may include a substrate 21, an element isolation layer 23, a third active region 43, an interface dielectric layer 47, a first gate dielectric layer 48, a pair of first source/drain regions 55, a third gate electrode G3, a gate capping layer 76, a gate spacer 78, and an interlayer insulating layer 79. A second layer 162 may directly contact the first gate dielectric layer 48.

Referring to FIG. 25, the semiconductor devices according to example embodiments of the disclosure may include a substrate 21, an element isolation layer 23, a fourth active region 44, an interface dielectric layer 47, a second gate dielectric layer 49, a pair of second source/drain regions 59, a fourth gate electrode G4, a gate capping layer 76, a gate spacer 78, and an interlayer insulating layer 79. A third layer 163 may directly contact the second gate dielectric layer 49.

Referring to FIG. 26, the semiconductor devices according to example embodiments of the disclosure may include a substrate 21, an element isolation layer 23, a fifth active region 45, an interface dielectric layer 47, a second gate dielectric layer 49, a pair of second source/drain regions 59, a fifth gate electrode G5, a gate capping layer 76, a gate spacer 78, and an interlayer insulating layer 79. A fourth layer 164 may directly contact the second gate dielectric layer 49.

Referring to FIG. 27, the semiconductor devices according to example embodiments of the disclosure may include a substrate 21, an element isolation layer 23, a fifth active region 45, an interface dielectric layer 47, a first gate dielectric layer 48, a pair of second source/drain regions 59, a sixth gate electrode G6, a gate capping layer 76, a gate spacer 78, and an interlayer insulating layer 79. A fourth layer 164 may directly contact the first gate dielectric layer 48.

FIGS. 28 to 43 are sectional views explaining formation methods of semiconductor devices according to example embodiments of the disclosure. Each of FIGS. 28 to 43 may correspond to an enlarged view showing the first portion 31 of FIG. 5, the second portion 32 of FIG. 6, the third portion 33 of FIG. 7, the fourth portion 34 of FIG. 8, the fifth portion 35 of FIG. 9, and the sixth portion 36 of FIG. 10.

Figure 28:
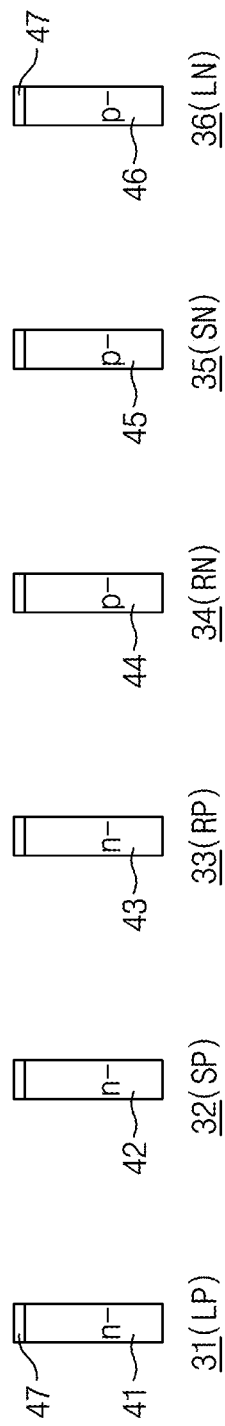

Referring to FIG. 28, an interface dielectric layer 47 may be formed on first to sixth active regions 41 to 46. The interface dielectric layer 47 may include a silicon oxide formed using a thermal oxidation process or a cleaning process. The interface dielectric layer 47 may directly contact the first to sixth active regions 41 to 46.

Figure 29:
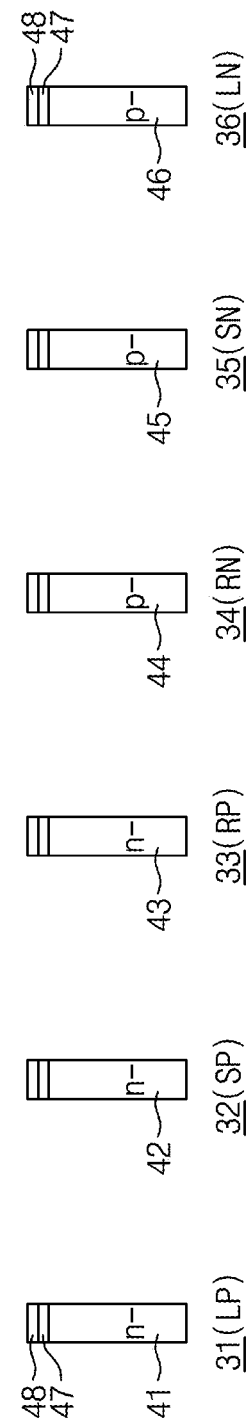

Referring to FIG. 29, a first gate dielectric layer 48 may be formed on the interface dielectric layer 47. The first gate dielectric layer 48 may include high-k dielectrics. In an embodiment, the first gate dielectric layer 48 may include HfO.

Figure 30:
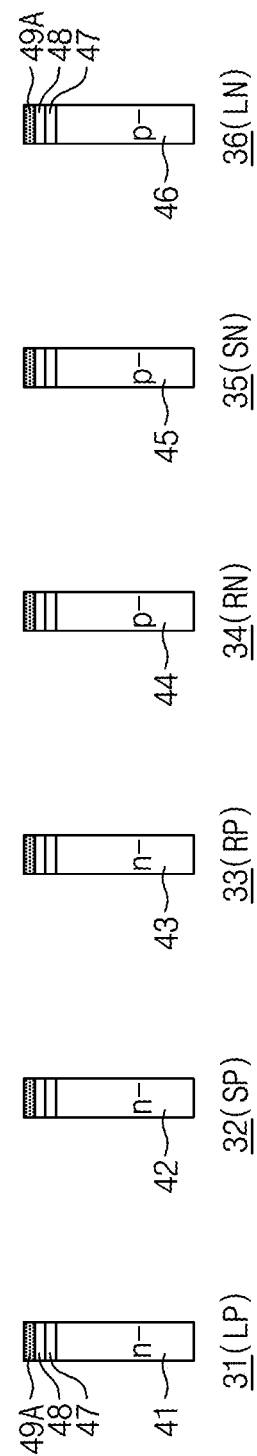

Referring to FIG. 30, an additive layer 49A may be formed on the first gate dielectric layer 48. In an embodiment, the additive layer 49A may include La or LaO.

Figure 31:
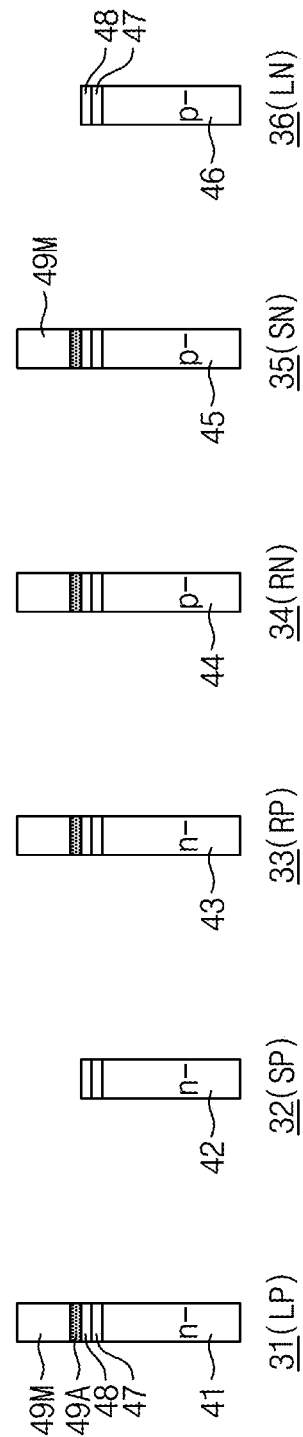

Referring to FIG. 31, a first mask pattern 49M may be formed to cover the additive layer 49A within a first area LP, a third area RP, a fourth area RN and a fifth area SN. Using the first mask pattern 49M as an etch mask, the additive layer 49A may be etched, thereby exposing the first gate dielectric layer 48 within a second area SP and a sixth area LN.

Referring to FIG. 32, the first mask pattern 49M may be removed. A second gate dielectric layer 49 may be formed by injecting a metal material in the additive layer 49A into the first gate dielectric layer 48 using an annealing process. In an embodiment, the second gate dielectric layer 49 may include HfLaO.

The second gate dielectric layer 49 may be formed on the interface dielectric layer 47 within the first area LP, the third area RP, the fourth area RN and the fifth area SN. The first gate dielectric layer 48 may remain on the interface dielectric layer 47 within the second area SP and the sixth area LN.

Referring to FIG. 33, nitrogen may be injected into the first gate dielectric layer 48 and the second gate dielectric layer 49 using a nitrogen injection process. The first gate dielectric layer 48 may include Hf, O, and N. The second gate dielectric layer 49 may include Hf, La, O, and N. In an embodiment, the first gate dielectric layer 48 may include HfON.

The second dielectric layer 49 may include HfLaON.

Figure 34:
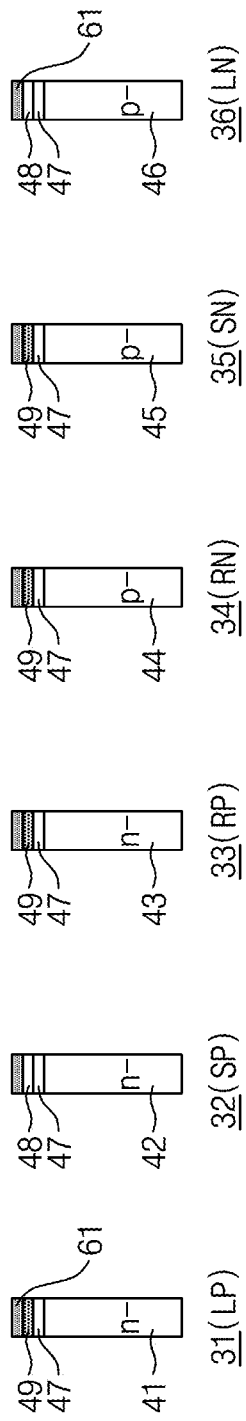

Referring to FIG. 34, a first layer 61 may be formed on the first gate dielectric layer 48 and the second gate dielectric layer 49. The first layer 61 may include Ti, O, and N. In an embodiment, the first layer 61 may include TiON. The first layer 61 may have a thickness of 0.7 to 2 nm.

Figure 35:
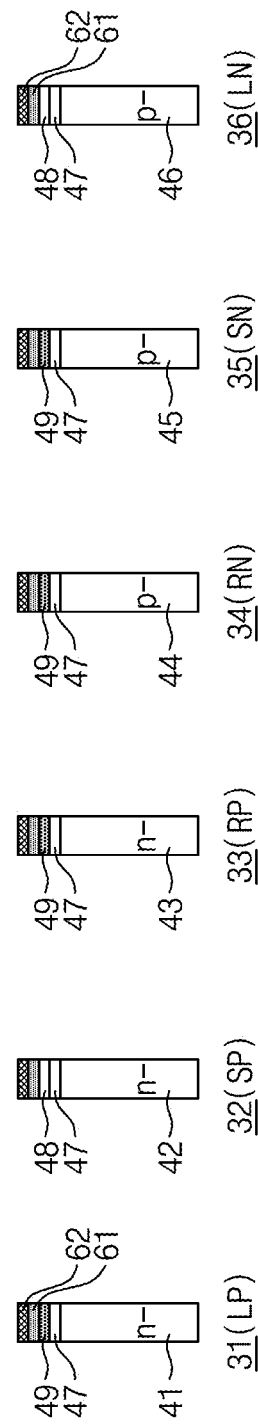

Referring to FIG. 35, a second layer 62 may be formed on the first layer 61. The second layer 62 may include Ti and N. In an embodiment, the second layer 62 may include TiN. The second layer 62 may have a thickness of 0.7 to 2 nm.

Referring to FIG. 36, a second mask pattern 62M may be formed to cover the second layer 62 within the first area LP and the second area SP. Using the second mask pattern 62M as an etch mask, the second layer 62 and the first layer 61 may be etched, thereby exposing the second gate dielectric layer 49 within the third area RP, the fourth area RN and the fifth area SN while exposing the first gate dielectric layer 48 within the sixth area LN. The first layer 61 and the second layer 62 may remain within the first area LP and the second area SP.

Referring to FIG. 37, the second mask pattern 62M may be removed. A third layer 63 may be formed on the second layer 62, the second gate dielectric layer 49 and the first gate dielectric layer 48. The third layer 63 may include Ti and N. In an embodiment, the third layer 63 may include TiN. The third layer 63 may have a thickness of 0.7 to 2 nm.

Figure 38:
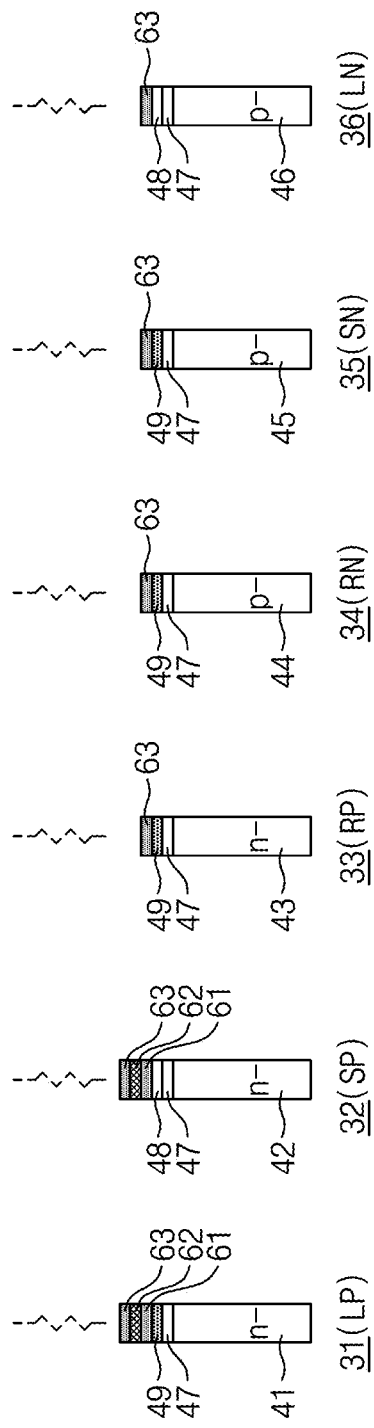

Referring to FIG. 38, oxygen may be injected into the third layer 63 using an oxygen injection process. The third layer 63 may include Ti, O, and N. In an embodiment, the third layer 63 may include TiON.

During execution of the oxygen injection process, oxygen may be injected into the second layer 62. The second layer 62 may include Ti, O, and N. In an embodiment, the second layer 62 may include TiON.

Figure 39:
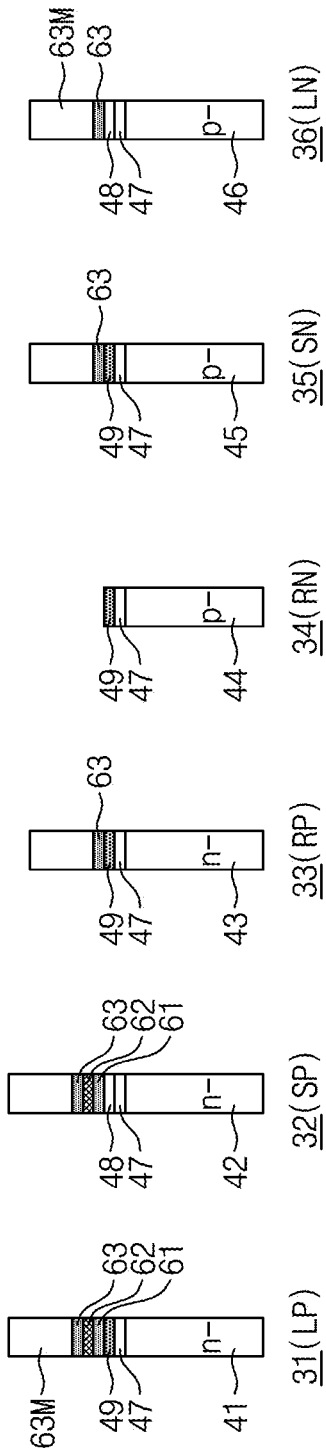

Referring to FIG. 39, a third mask 63M may be formed to cover the third layer 63 within the first area LP, the second area SP, the third area RP, the fifth area SN and the sixth area LN. Using the third mask pattern 63M as an etch mask, the third layer 63 may be etched, thereby exposing the second gate dielectric layer 49 within the fourth area RN.

Figure 40:
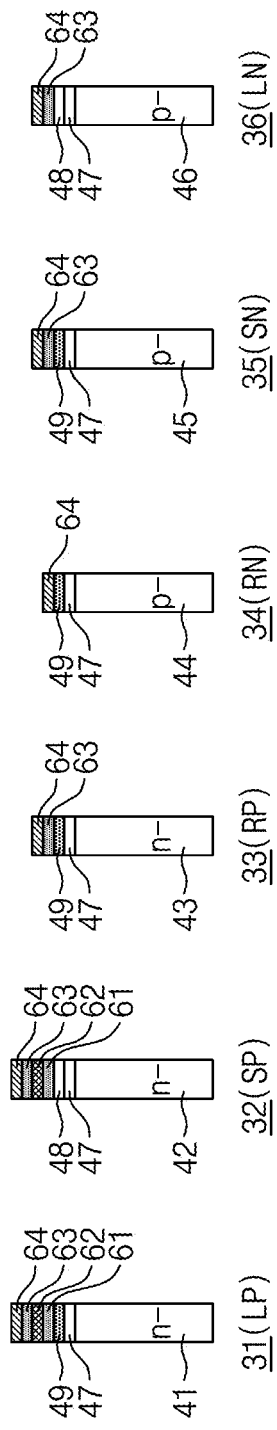

Referring to FIG. 40, the third mask pattern 63M may be removed. A fourth layer 64 may be formed on the third layer 63 and the second gate dielectric layer 49. The fourth layer 64 may include Ti and N. In an embodiment, the fourth layer 64 may include TiN. The fourth layer 64 may have a thickness of 0.7 to 2 nm.

Figure 41:
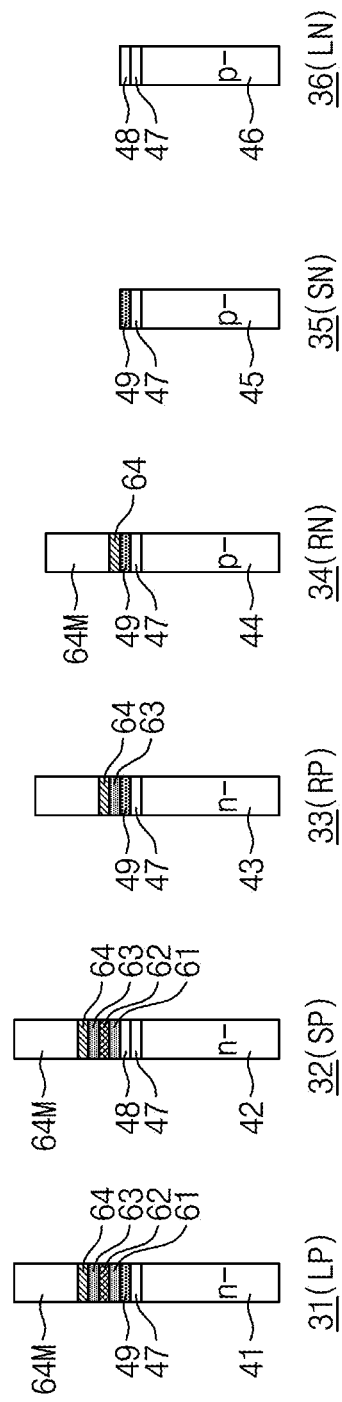

Referring to FIG. 41, a fourth mask pattern 64M may be formed to cover the fourth layer 64 within the first area LP, the second area SP, the third area RP and the fourth area RN. Using the fourth mask pattern 64M as an etch mask, the fourth layer 64 and the third layer 63 may be etched, thereby exposing the second gate dielectric layer 49 within the fifth area SN while exposing the first gate dielectric layer 48 within the sixth area LN.

Figure 42:
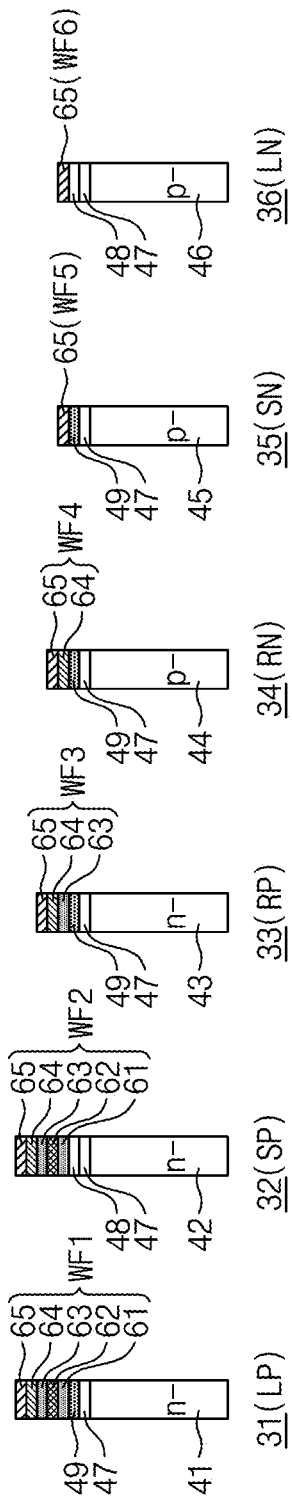

Referring to FIG. 42, the fourth mask pattern 64M may be removed, thereby exposing the fourth layer 64. A fifth layer 65 may be formed on the fourth layer 64, the second gate dielectric layer 49 and the first gate dielectric layer 48. The fifth layer 65 may include TiAlC. The fifth layer 65 may have a thickness of 0.7 to 2 nm.

Figure 43:
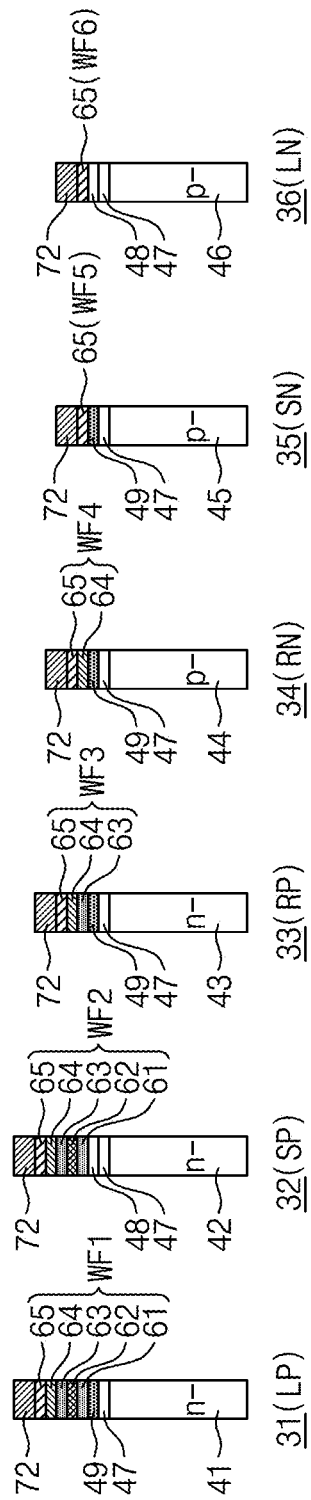

Referring to FIG. 43, a first gate conductive layer 72 may be formed on the fifth layer 65. The first gate conductive layer 72 may include TiN. The thickness of the first gate conductive layer 72 may be greater than that of the fifth layer 65 by 2 to 1,000 times.

Again referring to FIG. 1, a second gate conductive layer 74 may be formed on the first gate conductive layer 72. The second gate conductive layer 74 may include a metal, a metal nitride, a metal oxide, a metal silicide, conductive carbon, polysilicon, or a combination thereof. For example, the second gate conductive layer 74 may include a W layer. A gate capping layer 76 may be formed on the second gate conductive layer 74. The gate capping layer 76 may include a silicon oxide, a silicon nitride, a silicon oxynitride, a silicon boron nitride (SiBN), a silicon carbon nitride (SiCN), low-k dielectrics, high-k dielectrics, or a combination thereof. For example, the gate capping layer 76 may include a silicon nitride.

In accordance with example embodiments of the disclosure, a first gate dielectric layer having high-k dielectrics containing La, a second gate dielectric layer having high-k dielectrics, and first to sixth work function layers having combinations of first to fifth layers may be provided. A combination of the first and second gate dielectric layers and the first to sixth work functions may constitute a plurality of transistors having different threshold voltages. Semiconductor devices having superior electrical characteristics while being advantageous in terms of mass production efficiency may be embodied.

While the embodiments of the disclosure have been described with reference to the accompanying drawings, it should be understood by those skilled in the art that various modifications may be made without departing from the scope of the disclosure and without changing essential features thereof. Therefore, the above-described embodiments should be considered in a descriptive sense only and not for purposes of limitation.

What is claimed is:

1. A semiconductor device comprising:
a substrate;
a first transistor on the substrate, the first transistor having a first threshold voltage,
the first transistor including a first N-type active region defined on the substrate, a first gate electrode extending across the first N-type active region, and a first gate dielectric layer between the first N-type active region and the first gate electrode,
the first gate electrode having a first work function layer,
the first gate dielectric layer having high-k dielectrics containing La,
the first work function layer including a first layer on the first gate dielectric layer and having TiON, a second layer on the first layer and having TiN or TiON, a third layer on the second layer and having TiON, a fourth layer on the third layer and having TiN, and a fifth layer on the fourth layer and having TiAlC; and
a second transistor on the substrate, the second transistor having a second threshold voltage different from the first threshold voltage,
the second transistor including a first P-type active region defined on the substrate, a second gate electrode extending across the first P-type active region, and a second gate dielectric layer between the first P-type active region and the second gate electrode,
the second gate electrode having a second work function layer,
the second gate dielectric layer having high-k dielectrics, and
the second work function layer including the fifth layer directly contacting the second gate dielectric layer.

2. The semiconductor device according to claim 1, wherein
the first gate dielectric layer comprises Hf, La, and N, and
the second gate dielectric layer comprises Hf, O, and N.

3. The semiconductor device according to claim 1, wherein
the first work function layer covers an upper surface of the first N-type active region and side surfaces of the first N-type active region,
a lowermost end of the first work function layer is nearer to a lower surface of the substrate than to an uppermost end of the first N-type active region,
the second work function layer covers upper and side surfaces of the first P-type active region, and
a lowermost end of the second work function layer is disposed nearer to the lower surface of the substrate than to an uppermost end of the first P-type active region.

4. The semiconductor device according to claim 1, wherein the first layer directly contacts the first gate dielectric layer.

5. The semiconductor device according to claim 1, wherein
the first gate dielectric layer extends on a side surface of the first work function layer,
an uppermost end of the first gate dielectric layer is spaced farther from a lower surface of the substrate than from a lowermost end of the first work function layer,
the second gate dielectric layer extends on a side surface of the second work function layer, and
an uppermost end of the second gate dielectric layer is spaced farther from the lower surface of the substrate than from a lowermost end of the second work function layer.

6. The semiconductor device according to claim 1, wherein each of the first gate electrode and the second gate electrode further comprises:
a first gate conductive layer on the fifth layer, the first gate conductive layer having TiN; and
a second gate conductive layer on the first gate conductive layer, the second gate conductive layer having W.

7. The semiconductor device according to claim 1, further comprising:
a third transistor on the substrate, the third transistor having a third threshold voltage different from the first threshold voltage, wherein
an absolute value of the third threshold voltage is smaller than an absolute value of the first threshold voltage,
the third transistor comprises a second N-type active region defined on the substrate, a third gate electrode extending across the second N-type active region, and the second gate dielectric layer,
the third gate electrode has a third work function layer,
the second gate dielectric layer of the third transistor is between the second N-type active region and the third gate electrode, and
the third work function layer comprises the first layer on the second gate dielectric layer, the second layer on the first layer, the third layer on the second layer, the fourth layer on the third layer, and the fifth layer on the fourth layer.

8. The semiconductor device according to claim 1, further comprising:
a fourth transistor on the substrate, the fourth transistor having a fourth threshold voltage different from the first threshold voltage, wherein
an absolute value of the fourth threshold voltage is greater than an absolute value of the first threshold voltage,
the fourth transistor comprises a third N-type active region defined on the substrate, a fourth gate electrode extending across the third N-type active region, and the first gate dielectric layer,
the fourth gate electrode has a fourth work function layer,
the first gate dielectric layer of the fourth transistor is between the third N-type active region and the fourth gate electrode, and
the fourth work function layer comprises the third layer on the first gate dielectric layer, the fourth layer on the third layer, and the fifth layer on the fourth layer.

9. The semiconductor device according to claim 1, further comprising:
a fifth transistor on the substrate, the fifth transistor having a fifth threshold voltage higher than the second threshold voltage, wherein
the fifth transistor comprises a second P-type active region defined on the substrate, a fifth gate electrode extending across the second P-type active region, and the first gate dielectric layer between the second P-type active region and the fifth gate electrode,
the fifth gate electrode has a fifth work function layer, and
the fifth work function layer comprises the fourth layer on the first gate dielectric layer and the fifth layer on the fourth layer.

10. The semiconductor device according to claim 1, further comprising:

a sixth transistor on the substrate, the sixth transistor having a sixth threshold voltage lower than the second threshold voltage, wherein
the sixth transistor comprises a third P-type active region defined on the substrate, a sixth gate electrode extending across the third P-type active region, and the first gate dielectric layer between the third P-type active region and the sixth gate electrode,
the sixth gate electrode has a sixth work function layer, and
the sixth work function layer comprises the fifth layer on the first gate dielectric layer.

11. The semiconductor device according to claim 10, wherein the fifth layer directly contacts the first gate dielectric layer.

12. A semiconductor device comprising:
a substrate;
a first transistor on the substrate, the first transistor having a first threshold voltage,
the first transistor including a first N-type active region having a plurality of first N-type active patterns vertically aligned on the substrate, a first gate electrode extending across the first N-type active region, and a first gate dielectric layer between the first N-type active region and the first gate electrode,
the first gate electrode having a first work function layer,
the first gate dielectric layer having high-k dielectrics containing La,
the first work function layer including a first layer on the first gate dielectric layer and having TiON, a second layer on the first layer and having TiN or TiON, a third layer on the second layer and having TiON, a fourth layer on the third layer and having TiN, and a fifth layer on the fourth layer and having TiAlC; and
a second transistor on the substrate, the second transistor having a second threshold voltage different from the first threshold voltage,
the second transistor including a first P-type active region having a plurality of first P-type active patterns vertically aligned on the substrate, a second gate electrode extending across the first P-type active region, and a second gate dielectric layer between the first P-type active region and the second gate electrode,
the second gate electrode having a second work function layer,
the second gate dielectric layer having high-k dielectrics, and
the second work function layer including the fifth layer directly contacting the second gate dielectric layer.

13. The semiconductor device according to claim 12, wherein
the first work function layer surrounds an upper surface, a lower surface and side surfaces of at least one of the plurality of first N-type active patterns, and
the second work function layer surrounds an upper surface, a lower surface and side surfaces of at least one of the plurality of first P-type active patterns.

14. The semiconductor device according to claim 12, further comprising:
a third transistor on the substrate, the third transistor having a third threshold voltage different from the first threshold voltage, wherein
an absolute value of the third threshold voltage is smaller than an absolute value of the first threshold voltage,
the third transistor comprises a second N-type active region having a plurality of second N-type active patterns vertically aligned on the substrate, a third gate electrode extending across the second N-type active region, and the second gate dielectric layer,
the second gate dielectric layer of the third transistor is between the second N-type active region and the third gate electrode,
the third gate electrode has a third work function layer, and
the third work function layer comprises the first layer on the second gate dielectric layer, the second layer on the first layer, the third layer on the second layer, the fourth layer on the third layer, and the fifth layer on the fourth layer, and
the third work function layer surrounds an upper surface, a lower surface, and a side surface of at least one of the plurality of second N-type active patterns.

15. The semiconductor device according to claim 12, further comprising:
a fourth transistor on the substrate, the fourth transistor having a fourth threshold voltage different from the first threshold voltage, wherein
an absolute value of the fourth threshold voltage is greater than an absolute value of the first threshold voltage,
the fourth transistor comprises a third N-type active region having a plurality of third N-type active patterns vertically aligned on the substrate, a fourth gate electrode extending across the third N-type active region, and the first gate dielectric layer,
the fourth gate electrode has a fourth work function layer,
the first gate dielectric layer of the fourth transistor is between the third N-type active region and the fourth gate electrode,
the fourth work function layer comprises the third layer on the first gate dielectric layer, the fourth layer on the third layer, and the fifth layer on the fourth layer, and
the fourth work function layer surrounds an upper surface, a lower surface and side surfaces of at least one of the plurality of third N-type active patterns.

16. The semiconductor device according to claim 12, further comprising:
a fifth transistor on the substrate, the fifth transistor having a fifth threshold voltage higher than the second threshold voltage, wherein
the fifth transistor comprises a second P-type active region having a plurality of second P-type active patterns vertically aligned on the substrate, a fifth gate electrode extending across the second P-type active region, and the first gate dielectric layer,
the fifth gate electrode has a fifth work function layer,
the first gate dielectric layer of the fifth transistor is between the second P-type active region and the fifth gate electrode,
the fifth work function layer comprises the fourth layer on the first gate dielectric layer and the fifth layer on the fourth layer, and
the fifth work function layer surrounds an upper surface, a lower surface, and side surfaces of at least one of the plurality of second P-type active patterns.

17. The semiconductor device according to claim 12, further comprising:
a sixth transistor on the substrate, the sixth transistor having a sixth threshold voltage lower than the second threshold voltage, wherein
the sixth transistor comprises a third P-type active region having a plurality of third P-type active patterns vertically aligned on the substrate, a sixth gate electrode extending across the third P-type active region, and the first gate dielectric layer, the sixth gate electrode has a sixth work function layer, the first gate dielectric layer of the sixth transistor is between the third P-type active region and the sixth gate electrode, the sixth work function layer comprises the fifth layer on the first gate dielectric layer, and the sixth work function layer surrounds an upper surface, a lower surface, and side surfaces of at least one of the plurality of third P-type active patterns.

18. A semiconductor device comprising:

a substrate;

first to third N-type active regions and first to third P-type active regions on the substrate, the first to third N-type active regions and the first to third P-type active regions being spaced apart from one another;

a first gate electrode extending across the first N-type active region, the first gate electrode having a first work function layer;

a second gate electrode extending across the first P-type active region, the second gate electrode having a second work function layer;

a third gate electrode extending across the second N-type active region, the third gate electrode having a third work function layer;

a fourth gate electrode extending across the third N-type active region, the fourth gate electrode having a fourth work function layer;

a fifth gate electrode extending across the second P-type active region, the fifth gate electrode having a fifth work function layer;

a sixth gate electrode extending across the third P-type active region, the sixth gate electrode having a sixth work function layer;

a first gate dielectric layer between the first N-type active region and the first gate electrode, the first gate dielectric layer between the third N-type active region and the fourth gate electrode, the first gate dielectric layer between the second P-type active region and the fifth gate electrode, and the first gate dielectric layer between the third P-type active region and the sixth gate electrode, the first gate dielectric layer having high-k dielectrics containing La; and a second gate dielectric layer between the first P-type active region and the second gate electrode, the second gate dielectric layer between the second N-type active region and the third gate electrode, the second gate dielectric layer having high-k dielectrics;

a first layer, a second layer, a third layer, a fourth layer, and a fifth layer on the substrate, the first layer including TiON, the second layer including TiN or TiON, the third layer including TiON, the fourth layer including TiN, the fifth layer including TiAlC, the first work function layer including the first layer on the first gate dielectric layer, the second layer on the first layer, the third layer on the second layer, the fourth layer on the third layer, and the fifth layer on the fourth layer, the second work function layer including the fifth layer directly contacting the second gate dielectric layer, the third work function layer including the first layer on the second gate dielectric layer, the second layer on the first layer, the third layer on the second layer, the fourth layer on the third layer, and the fifth layer on the fourth layer, the fourth work function layer including the third layer on the first gate dielectric layer, the fourth layer on the third layer, and the fifth layer on the fourth layer, the fifth work function layer including the fourth layer on the first gate dielectric layer and the fifth layer on the fourth layer, and the sixth work function layer including the fifth layer directly contacting the first gate dielectric layer.

19. The semiconductor device according to claim 18, wherein the first gate dielectric layer comprises HfLaON, and the second gate dielectric layer comprises HfON.

20. The semiconductor device according to claim 18, wherein each of the first gate electrode, the second gate electrode, the third gate electrode, the fourth gate electrode, the fifth gate electrode, and the sixth gate electrode further comprise:

a first gate conductive layer on the fifth layer, the first gate conductive layer having TiN; and a second gate conductive layer on the first gate conductive layer, the second gate conductive layer having W.

* * * * *